(12) United States Patent
Bosiljevac et al.

(10) Patent No.: US 9,605,999 B2
(45) Date of Patent: Mar. 28, 2017

(54) LIGHT SOURCES WITH HIGHLY STABLE OUTPUT INTENSITY

(71) Applicants: Marko Bosiljevac, Zagreb (HR); Dubravko Ivan Babic, Milpitas, CA (US)

(72) Inventors: Marko Bosiljevac, Zagreb (HR); Dubravko Ivan Babic, Milpitas, CA (US)

(*) Notice: Subject to any disclaimer, the term of this patent is extended or adjusted under 35 U.S.C. 154(b) by 152 days.

(21) Appl. No.: 14/081,088

(22) Filed: Nov. 15, 2013

(65) Prior Publication Data
US 2015/0136945 A1    May 21, 2015

(51) Int. Cl.
| | | |
|---|---|---|
| *G01J 1/04* | (2006.01) | |
| *G02B 27/10* | (2006.01) | |
| *G02B 27/28* | (2006.01) | |
| *G01J 1/32* | (2006.01) | |
| *G01J 3/10* | (2006.01) | |
| *G01J 4/04* | (2006.01) | |
| *G01J 3/02* | (2006.01) | |
| *H01S 5/0683* | (2006.01) | |
| *H01S 5/183* | (2006.01) | |

(52) U.S. Cl.
CPC .............. *G01J 1/0429* (2013.01); *G01J 1/32* (2013.01); *G01J 3/0224* (2013.01); *G01J 3/10* (2013.01); *G01J 4/04* (2013.01); *G02B 27/108* (2013.01); *G02B 27/283* (2013.01); *H01S 5/0683* (2013.01); *H01S 5/183* (2013.01)

(58) Field of Classification Search
CPC ...... G01J 1/0238; G01J 1/4228; G01J 1/0429; G01J 1/32; G01J 4/04; G01J 3/0224; G02B 5/3025; G02B 5/30; G02B 27/108; G02B 27/283; G01K 1/20; H01S 5/183
See application file for complete search history.

(56) References Cited

U.S. PATENT DOCUMENTS

| | | | | |
|---|---|---|---|---|
| 4,556,293 A | * | 12/1985 | Burns | G02B 6/105 257/E33.067 |
| 6,314,119 B1 | * | 11/2001 | Morton | H01S 3/0057 372/25 |
| 6,720,547 B1 | * | 4/2004 | Rajadhyaksha | G01N 21/21 250/208.1 |
| 2002/0167645 A1 | * | 11/2002 | Johnson | 353/20 |
| 2004/0094698 A1 | * | 5/2004 | Imaki et al. | 250/225 |
| 2004/0252619 A1 | * | 12/2004 | Hwang | 369/112.01 |
| 2008/0067321 A1 | * | 3/2008 | Miyamoto et al. | 250/201.5 |

* cited by examiner

*Primary Examiner* — Francis M Legasse, Jr.
*Assistant Examiner* — Don Williams
(74) *Attorney, Agent, or Firm* — Shalini Venkatesh

(57) ABSTRACT

A light source includes a semiconductor light emitter having an electrical drive input and operatively configured to emit a light beam; a first weakly polarizing beam splitter positioned to capture the light beam, reflecting one portion, and transmitting another portion with an output intensity P. The light source includes a second polarizing beam splitter positioned to capture the reflected portion of the light beam and split it into first and second detector light beams of orthogonal polarizations. The light source further includes first and second detectors capturing those detector light beams, and is configured to deliver corresponding first and second output signals from corresponding detector outputs. The light source includes an electronic circuit coupled to those electrical outputs and to the electrical drive input of the light emitter.

6 Claims, 13 Drawing Sheets

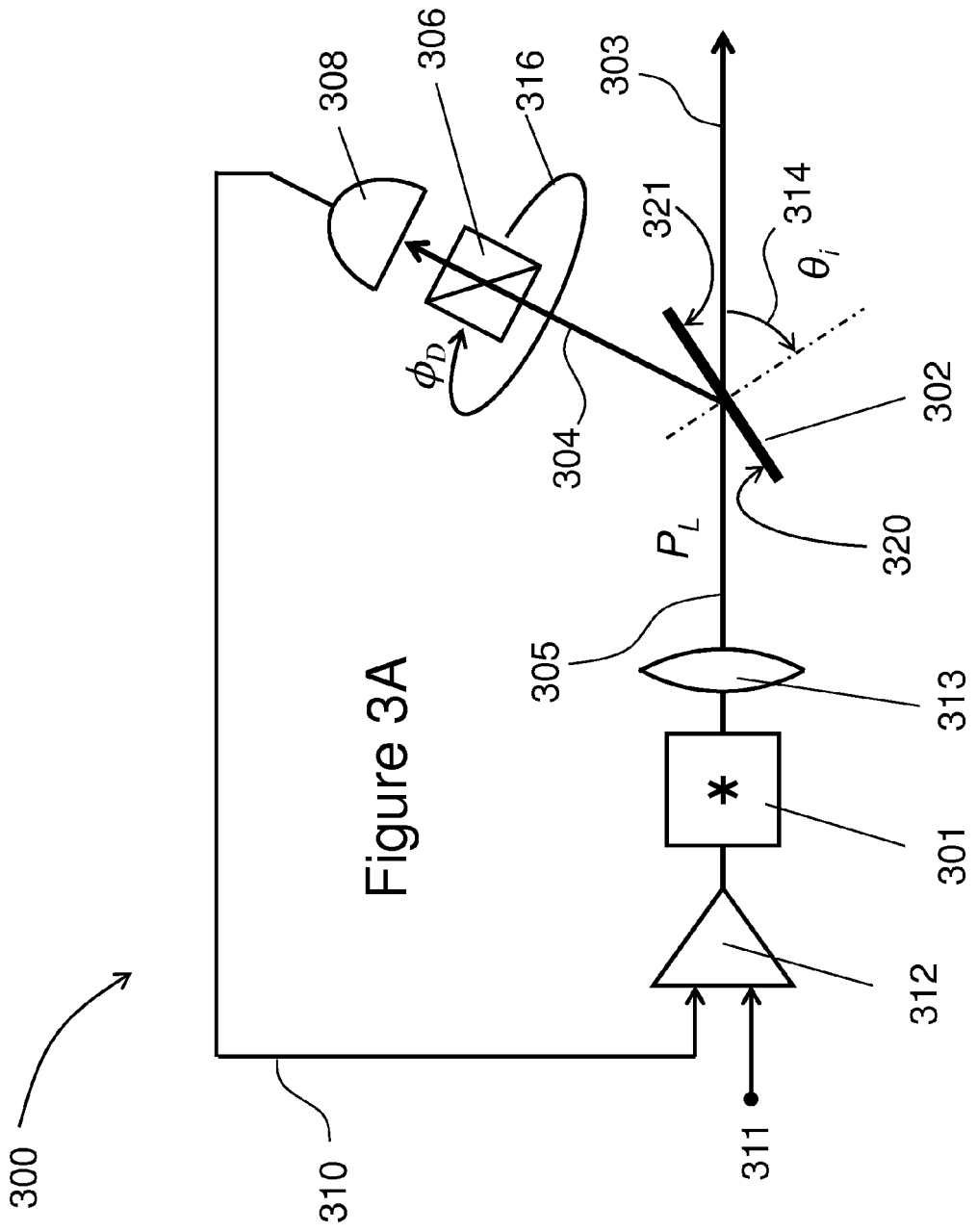

Figure 8A

LIGHT SOURCES WITH HIGHLY STABLE OUTPUT INTENSITY

BACKGROUND

Constant-intensity-light sources are ubiquitous in optical sensing systems used in medical, environmental, and industrial applications. Temperature stability of these optical sources is essential as it is the foundation of the instrument accuracy, be it through calibration at manufacturing time or in real time correction. Optical and electrical properties of all light emitting components and optical materials vary with temperature. For this reason an absolutely stable source does not exist. Rather, sources of varying stability are developed for specific applications. In many applications today, where lasers are needed, the control of laser output intensity is realized by stabilizing the laser's temperature which in turns stabilizes its wavelength and output. Using thermo-electric-coolers (TEC) raises the cost of such laser sources and lowers their wall-plug efficiency. In many applications, for example, actuators for sensors or machine vision, stable intensity and low power consumption are important, while stable emission wavelength is not critical. In this case, uncooled source may be used in combination with sophisticated intensity compensation that makes the source immune to temperature changes over some temperature range and source degradation. Uncooled sources are preferred in systems where size and cost are important.

The stabilization of the output beam intensity from lasers and light-emitting diodes is conventionally performed using a closed-loop control system illustrated in FIG. 1 (PRIOR ART). A light source 101, which may be an incandescent lamp, a light-emitting diode, or a laser, is powered by control electronic 106 and emits a collimated light beam 105 onto a beam splitter 102. The transmitted portion of the beam 103 is useful light that may be used for illumination or measurement/sensing. The reflected portion 104 of the incident light 105 is captured by the photodetector 107. The intensity of the reflected beam 104 is converted to electric current 108 in the photodetector 107. The control electronics 106 compares the reflected beam 104 intensity in form of current 108 against a reference 110.

The primary factors producing intensity drift in the output beam intensity versus temperature are (a) temperature drift in the reference 110, (b) the change in the emission wavelength or emission spectra of the light source with temperature, which in turn can change the transmittance to reflectivity ratio of the beam-splitter, and (c) scattered light reaching the detector and offsetting the measured power is also temperature dependent. If the optical source 101 degrades with time, the control electronics 106 will make necessary correction in optical source 101 output intensity 103.

Constant-intensity optical sources based on lasers are known in the field. For example United States patent application 20120025714 by Downing and Babic discloses uses a vertical-cavity surface emitting laser and a weakly polarizing optical interference coating to achieve high stability over temperature and time. The operation of the invention disclosed relies on the temperature drift in the emission wavelength of single-mode linear-polarization-locked lasers. The fine adjustment of the output power temperature drift coefficient is adjusted by rotating the laser around the optical axis in order to adjust the beam's polarization. An important factor coming to play with a coherent optical source such as a single-mode laser is the appearance of interference fringes appearing on transparent objects external to the source. This is particularly problematic if the beam is used to measure the properties of liquids stored in containers with transparent walls. If interference is a problem in the measurement setup, there is an advantage in using incoherent optical sources. Light-emitting diodes have coherence length which is significantly smaller than the thickness of the walls on most glass pipes and test vials. For this reason, interference fringes rarely occur in the measurement.

Light-emitting diodes are used to provide constant light output with reliability, accuracy, and power efficiency that surpass incandescent lamps used in similar instruments historically. However, due to wavelength drift with temperature, high degree of intensity stability (better than 100 ppm/° C.) is not achievable due to the temperature variation in the systems components with wavelength.

An additional problem in realizing ultra-stable optical sources is the manufacturing tolerance of components that directly influence the stability response, such as, variation in detector responsivity, manufacturing variation in the interference coating characteristics (if used), or temperature dependence of the comparator at input to the control circuit.

This application discloses several embodiments of an optical source based on light-emitting diodes or lasers that feature high temperature stability of the output-beam intensity.

One of the objectives of this application is to disclose a highly temperature-stable uncooled optical source of incoherent light. Another objective is to disclose a highly temperature-stable uncooled optical source of coherent polarized light.

BRIEF DESCRIPTION OF THE INVENTION

This application discloses an improvement on the feedback-loop optical source disclosed in prior art (shown in FIG. 1) by introducing a correction that relies on temperature dependent polarization changes in the optical control loop. A baseline optical source using a light-emitting diode (LED) 100 with a feedback control-loop and a beam splitter is shown in FIG. 1 (PRIOR ART). A conventional closed-feedback loop optical source shown in FIG. 1 comprises a light-emitting diode or a laser 101 emitting a beam of light 105 which is incident on a beam-splitter 102; a portion of that incident light 105 is transmitted through the beam splitter 102 and becomes useful light beam 103 with controlled intensity, while a portion 104 of the incident beam 105 reflects off the beam-splitter 102 and is captured by a photodetector 107 where it is converted to electrical current 108 and compared to a reference current 110, the difference is amplified by a differential amplifier 101 and the output from the amplifier is used to drive the current through the light-emitting diode or laser 101. The beam-splitter may have an interference coating 109 deposited on its incident surface. The nonlinearities in the conversions between the driver 101 and light beam 105 intensity are corrected by the high gain of the control loop, but the temperature dependent changes in the photodetector 107 responsivity and the transmission through the beam splitter 102 are not accounted for.

If we denote with P the output intensity 103 of the light source, the output-intensity local temperature sensitivity is $dP(T)/dT$, defined at every temperature, and output-intensity temperature sensitivity is defined as $(P(T_2)-P(T_1))/(T_2-T_1)$, where $T_1$ and $T_2$ are the temperatures at the boundaries of the defined temperature range. When T varies over the temperature range $(T_1-T_2)$, the output-light beam 103 intensity will vary with temperature due to many effects, including the temperature and wavelength drift in the detector 107 responsivity, the drift in the reference source 110 or the comparison between the measured and reference values of current (at the input of the amplifier 101), and finally the temperature dependence of the refractive index in the glass or the optional coating 109 of the beam splitter 102. The wavelength drift occurs because the peak emission wavelength of light-emitting diodes drifts with temperature. For this reason, the temperature variation in the output beam 103 intensity becomes a result of two factors: the temperature performance of the components, but also the change with wavelength of the optical constants of the devices and materials. The wavelength drift is a direct function of the light-emitting diode temperature: these two are deterministically related, but vary from device to device owing to manufacturing variation and have to be experimentally determined for each component individually. FIG. 2 illustrates the emission spectrum of a commercially available red light-emitting diode measured at several different temperatures. This measurement reveals the key characteristic of light-emitting diodes: As the temperature increases, the output power P reduces with temperature (dP/dT<0) and the peak emission wavelength $\lambda_m$ increases with temperature ($d\lambda_m/dT>0$). For lasers, specifically vertical-cavity lasers, the output power may in some cases increase with temperature, but the peak emission wavelength always increases. The typical drift in peak emission wavelength for LEDs is around≈0.1 nm/° C.

The first level of output power stabilization of an LED or a laser is to pick off some of the output and feed it to an amplifier to correct the LED drive current as is shown in FIG. 1. However, if one measures the peak emission wavelength drift over temperature for the LED (or laser) in use, one can compute the equivalent temperature variation and the required transmission (T) to reflectivity (R) ratio (F=T/R) of the coating 109 on the splitter 102 that would stabilize the output. One then uses this knowledge to design the interference coating 109 so that it produces a change in the output beam intensity 103 with temperature that approximately cancels the temperature drift in the output-beam intensity arising from all other effects in the optical source 100. We refer to this approach as the second level of stabilization or compensation and it comprises designing an optical coating 109 so that the beam-splitter 102 transmission/reflection ratio F approximately matches the temperature dependence of the baseline system. The difficulty with this second level of compensation is that the interference coating on the beamsplitter has to be identical each time it is manufactured and it would have to track (be adjusted) for every batch of LEDs or lasers that is used in the source. Below we disclose a third level of compensation that resolves this problem by using polarization of the optical coating.

In one embodiment of the present invention, temperature compensation of light-source output power is realized by driving an LED in proportion to the degree of polarization of the beam reflected on the weakly polarizing beam splitter—this is referred to as the third-level compensation. The weighting of the reflected beam polarization is done using either a manually or electronically adjustable polarizer or an electronically or manually controllable polarization analyzer. The electronic control is performed using a voltage controlled resistor (a field-effect transistor operated in the linear mode), voltage controlled variable gain amplifier, or by digital control.

The beam emitted from the LED is unpolarized and becomes polarized upon reflection on a first weakly-polarizing beam splitter. The polarization state of the reflected beam is resolved by either using an adjustable polarizer, which is disclosed as Embodiment A "Adjustable Polarizer", or by using two detectors and a second polarizing beam splitter to resolve the beam's polarization, which is disclosed as Embodiment B "Polarization Analyzer" in the following text. Embodiment B, can also be used with a laser in place of an LED with same structure (referred to as Embodiment C below).

For purposes of this application, a beam polarizer is an optical component that transmits (or reflects) a beam of first polarization preferentially and reflects (or transmits) the beam with polarization orthogonal to said first polarization. As is well known in the art, a beam polarizer may be realized as a polarizing beam splitter, as a wire-polarizer, or in other ways. The quality of practical polarizers is expressed in their polarization discrimination ratio (or just polarization ratio) which is the ratio of the transmission (or reflection) intensity coefficients of the two orthogonal polarizations (typically the larger divided by smaller), as is well known in the art. A good polarizer may exhibit a discrimination ratio of 100 or much higher more. A polarizing beam splitter is a polarizer which reflects light of first polarization and transmits light with polarization orthogonal to first polarization. Polarizing beam splitters are available from sources such as Edmunds Optics, Inc. from Barrington, N.J., USA.

For the purposes of this application, a weakly polarizing optical coating means a coating that exhibits a polarization ratio of the order of 10 or less when an unpolarized beam is incident on it. This type of coating would be a poor polarizer, but it is useful in the embodiments disclosed in this application. The weakly polarizing reflector may also be a weakly polarizing beam splitter where the reflected and transmitted beams are not parallel. In other words, when an unpolarized beam is incident on a weakly-polarizing reflector or beam splitter, the reflected (or transmitted) light beam will exhibit a degree of polarization less than around 90%. Degree of polarization is defined as the ratio of the intensity of the polarized component to the total intensity of an optical beam. This definition is explained in publicly available texts such as *Statistical Optics* by Joseph W. Goodman, published by John Wiley & Sons, 1985.

BRIEF DESCRIPTION OF THE DRAWINGS

FIG. 3A: (Embodiment A of the optical source using the present invention.

DETAILED DESCRIPTION OF THE INVENTION

The improvement in the stability of an LED-based optical light source is disclosed in the next two embodiments (A and B). Both embodiments use the following building blocks: a light-emitting diode, optional collimator lens, detector, differential amplifier that drives current through the LED. In normal operation, the optical source is operated at any temperature T within a temperature range $T_1$ to $T_2$. Embodiment C uses the same stabilizing principle, but a single-mode laser to provide the light beam.

Figure 1:
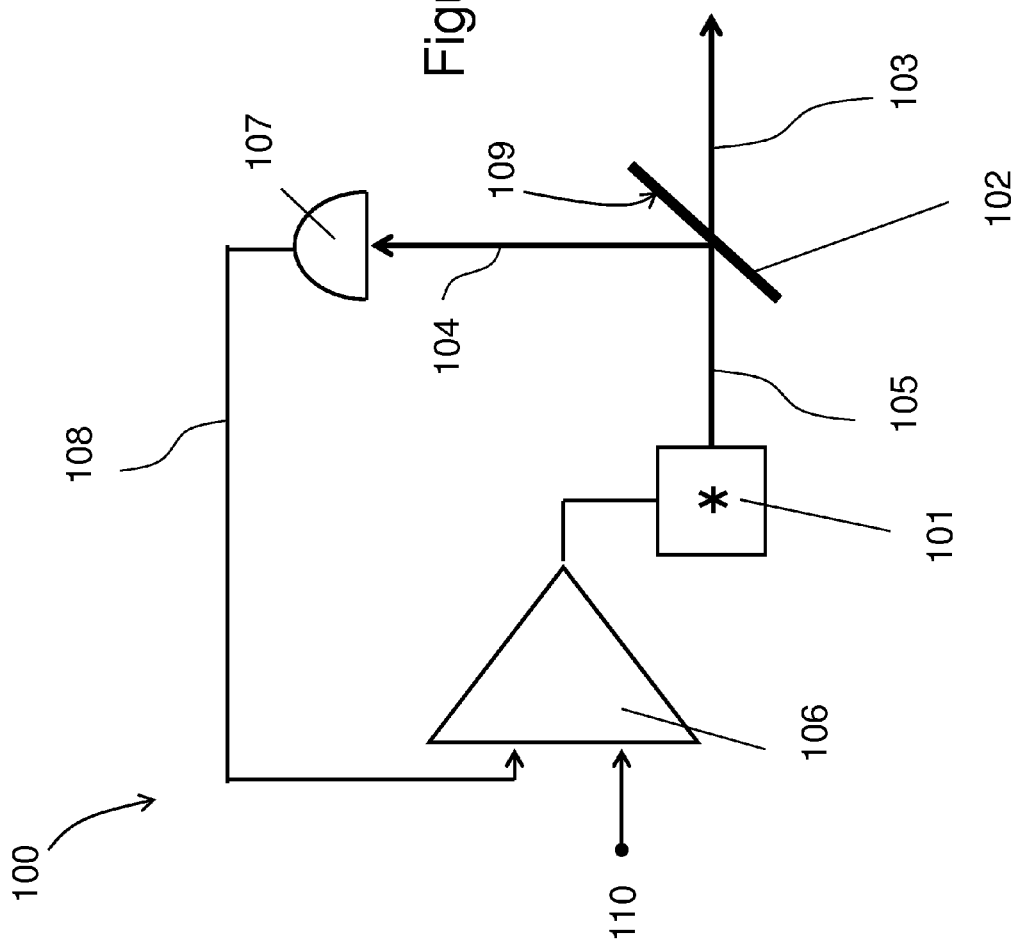
FIG. 1: Simplified schematic showing a classic optical source stabilized using a feedback control loop (PRIOR ART).
Figure 2:
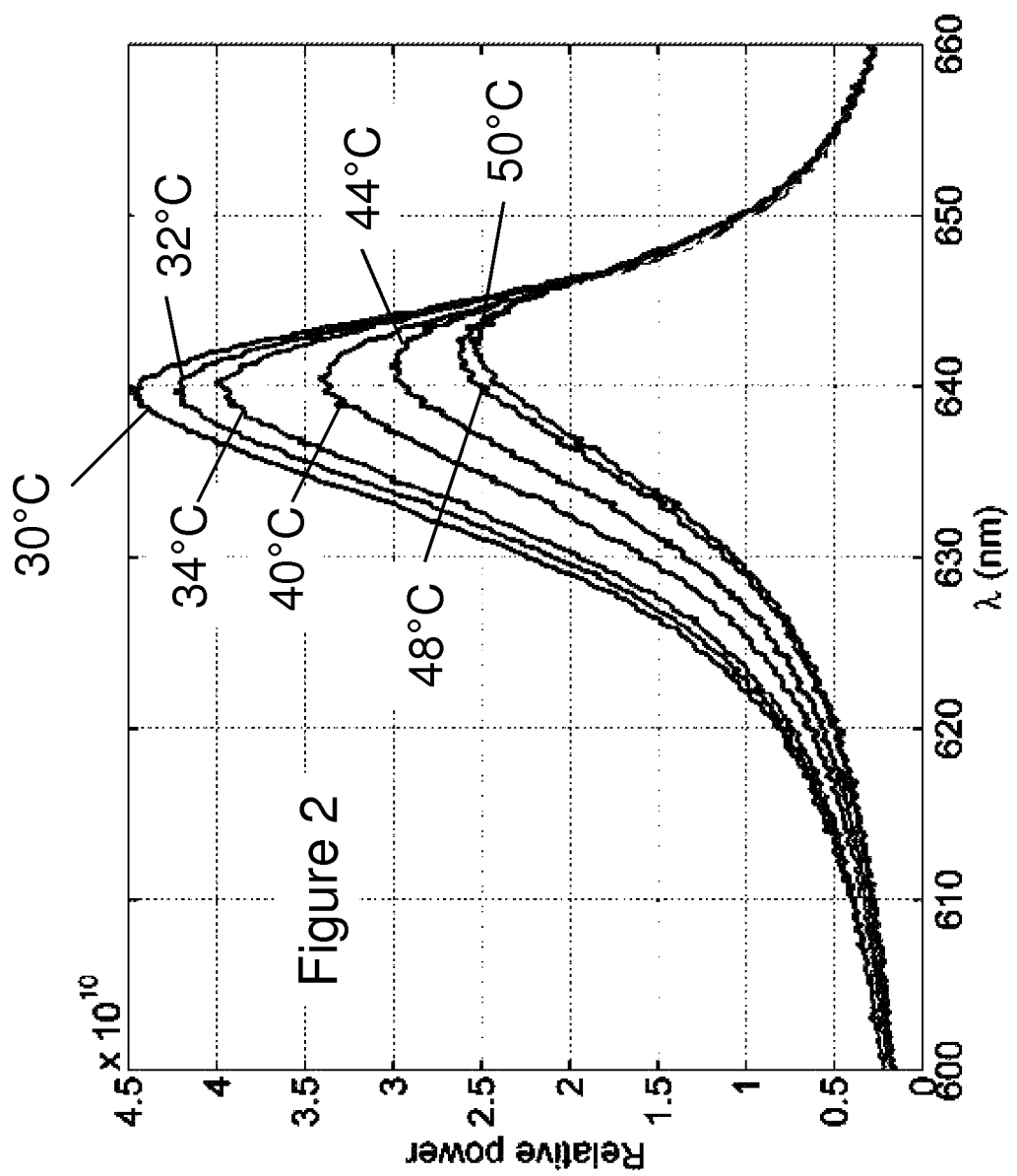
FIG. 2: An example of measured emission spectrum from a powered light-emitting diode at different temperatures.

The light-emitting diode emits a light beam having an emission spectrum $E(\lambda)$ [W/nm] which exhibits peak emission wavelength $\lambda_m$. (An example of such a spectrum for different temperatures is shown in FIG. 2.) As temperature varies from $T_1$ to $T_2$, the emission spectrum E changes: the peak wavelength shifts towards longer wavelengths approximately linearly ($d\lambda_m/dT \approx$ constant) accompanied with some spectrum $E(\lambda,T)$ broadening. When temperature varies from $T_1$ to $T_2$, the peak emission wavelength varies from $\lambda_{m1}$ to $\lambda_{m2}$. In as much as the emission spectrum of LEDs can have a full-width half maximum (FWHM) as large as 20 nm, the wavelength range ($\lambda_1$ to $\lambda_2$) over which the emission spectrum is non-negligible is larger than the extent of emission peak variation, namely, one has $\lambda_1 < \lambda_{m1} < \lambda_{m2} < \lambda_2$. We refer to $\lambda_{m1}$-$\lambda_{m2}$ as the peak emission wavelength range and we refer to $\lambda_1$-$\lambda_2$ as the emission spectrum range. In FIG. 1, the emission spectrum range is clearly greater than 60 nm.

The photodetectors used in the following embodiments are selected so that they capture the vast majority of the spectrum emitted by the light-emitting diode or laser used as a source. This selection generally refers to the type of material used as the absorbing section of the photodetector pn-junction. Commercial photodetectors are typically packaged into packages with windows for protection. The detectors used in the embodiments may have glass windows, unless the coherence length of the source (LED or laser) is comparable or greater than the thickness of the glass. In this case one may use detectors without a glass window.

A differential amplifier is an electronic circuit with two inputs and at least one output, wherein the output is proportional the difference of the signals present at the two inputs. The inputs and output from the amplifier may be current or voltage as is known in the art, but for a specific implementation of the temperature-stable source it may be advantageous to drive the LED with current and accept current as input, since the photodetector generates current when illuminated. The frequency response of the amplifier exhibits DC transfer and an upper cutoff frequency to pass the desired modulation frequency and limit the noise power as is well known in the art of amplifier design.

An angle of incidence $\theta_i$ for a beam incident on surface is defined as the angle between the incident beam and the direction normal to the surface. The beam and the surface normal define the plane of incidence.

I. Embodiment A

Adjustable Polarizer

Figure 3B:
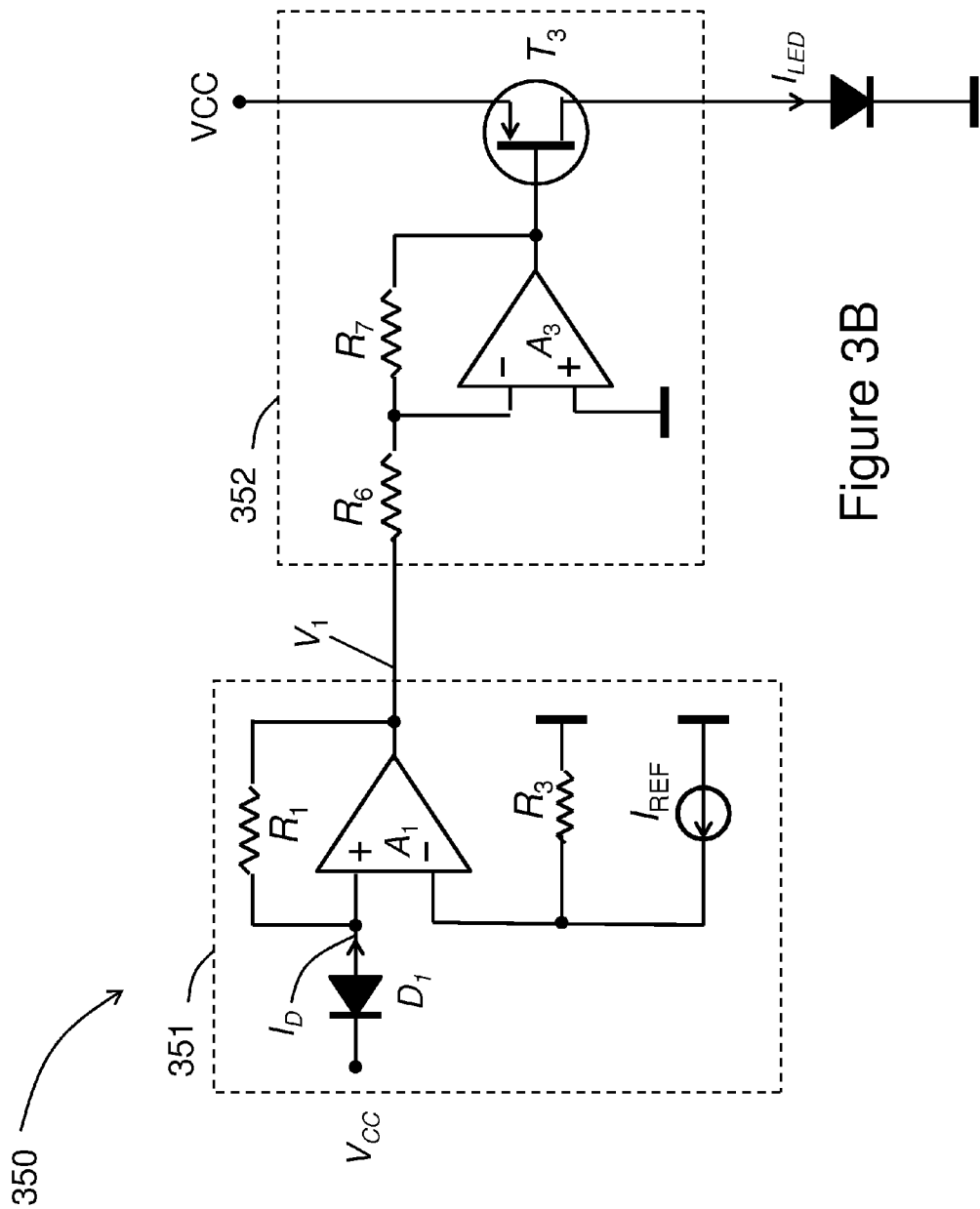
FIG. 3B One embodiment of the optical-source control circuit for Embodiment A optical source.

One set of embodiments of a temperature-stable incoherent optical source and a method to stabilize an incoherent optical source are illustrated with the help of FIGS. 3A and 3B. An optical source 300 comprises a light-emitting diode 301, a beam splitter 302, a rotatable polarizer 306, a monitor photodiode 308, and light-emitting diode driver circuit 312 configured as a differential amplifier with the current output 310 from the photodiode 308 and a reference current input 311 connected to the differential amplifier 312 inputs and the amplifier 312 output driving the light-emitting diode 301. The light emitted from light-emitting diode 301 is collimated using an optional collimator lens 313 (or lenses) and is incident on beam splitter 302. The surface of the beam splitter is coated with an interference coating 320. Since the light-emitting diodes produce a lot of spurious emissions in all directions, a baffle will be needed to encapsulate the light-emitting diode and let only the useful beam 305 out of the encapsulation (not shown in the figures).

Figure 8A:
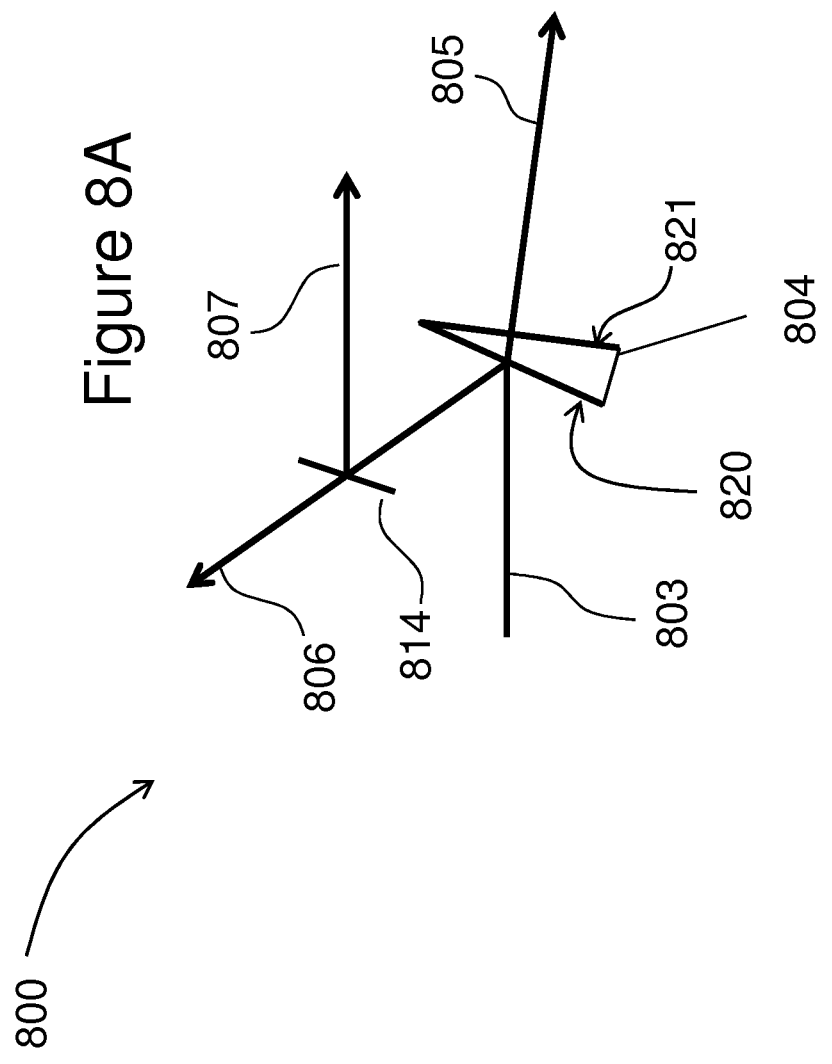
Figure 8B:
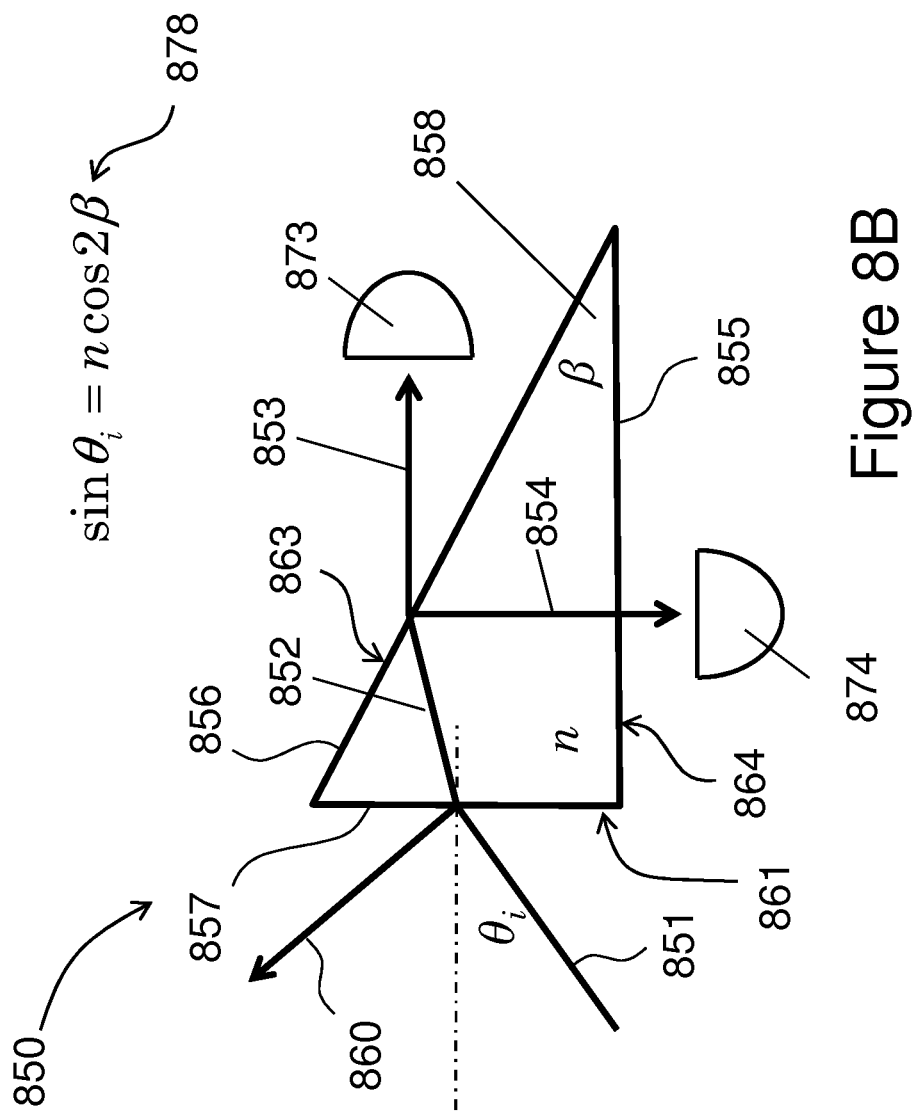
FIG. 8: (A) and (B) are two embodiments of beam splitters that utilize interference coatings on their surfaces to compensate the temperature dependence of the output power from optical sources made according to Embodiments A, B, or C.

The intensity of the light 305 incident on beam splitter 302 is denoted with $P_L$. The angle of incidence 314, denoted $\theta_i$, of the beam 305 onto the beam splitter 302 may take any value and is established by design prior to manufacturing. The angle has to be adjusted at optical source manufacturing time so that reflected light is captured by the detector 308, hence the position of the detector will be adjusted accordingly. The beam splitter 302 is coated with an interference coating 320 on the side that faces the light-emitting diode 301 so that the light beam 305 hits the interference coating 320 first; that side of the beam splitter is referred to as the incidence surface. In one embodiment, the back side, i.e., the other side, of the beam splitter is coated for reduced light reflectivity, i.e., an anti-reflective coating, while in another embodiment the back surface 321 of the beam splitter 302 is positioned at an acute angle relative to the incidence surface 320 so no light reflected on that back surface interferes with the reflected beam 304: In this case the beam splitter 302 is a prism, as disclosed in later part of the application in connection with FIGS. 8a and 8b, rather than a plate as shown in FIG. 3A. In yet another embodiment the back surface positioned at an acute angle relative to the incidence surface is coated so that the exiting light 303 traverses the back surface at normal incidence and the back surface is coated using an interference coating that exhibits transmission coefficient that varies with wavelength and is designed to assist in the temperature compensation. The coated beam splitter 302 is characterized with optical reflectivity and transmission spectra versus wavelength (and versus temperature, if this is needed) at specific incidence angle $\theta_i$ for TE and TM incidence: the transmission ($T_{TE}$, $T_{TM}$) and reflectivity ($R_{TE}$, $R_{TM}$) versus wavelength. The reflectivity is defined as the light power in the reflected beam 304 divided by the power in the incident beam 305. Transmittivity is defined as the power in the exiting beam 303 divided by the incident beam 305 for each polarization. This definition accounts for the fact that the two surfaces of the beam splitter may be inclined at an angle relative to each other.

Composite functions $F_{TE}$ and $F_{TM}$ versus wavelength are formed from the ratios of the transmitivity to reflectivity for TE and TM polarization as $F_{TE}=T_{TE}/R_{TE}$ and $F_{TM}=T_{TM}/R_{TM}$, respectively. The composite functions $F_{TE}$ and $F_{TM}$ characterize the optical characteristics of the beam splitter coated with the interference coating and are generally functions of wavelength, angle of incidence $\theta_i$, and temperature T.

The output beam 303 is generally weakly polarized and its intensity is given with $P_{OUT}=P_L\cdot(T_{TE}\ T_{TM})/2$, when the incident beam 305 is unpolarized. A portion 304 of the LED-emitted light 305 is reflected on the coated beam splitter 302, passes through the rotatable polarizer 306, and is incident on the monitor photodiode 308. The beam 305 is generally unpolarized, the beam 304 is weakly polarized (owing to the interference coating 320 on the beam splitter 302), and the rotatable polarizer 306 has a high polarization discrimination ratio. The rotatable polarizer 306 is operatively configured to rotate around an axis that is parallel to beam 304 (the rotation is indicated with the arrow 316). The amount of rotation of the rotatable polarizer around its axis is expressed in the detector polarization angle $\phi_D$. The detector polarization angle $\phi_D$ is defined as the angle between the passing polarization direction of the polarizer 306 and the plane of incidence of the beam splitter 302. The passing polarization direction of a polarizer is the direction of the electric field vector of a linearly polarized light beam for which the polarizer exhibits highest transmittance. Passing polarization direction is perpendicular to the direction of the light beam incident on the polarizer.

The differential amplifier 312 exhibits very high gain, so that, according to the theory of operational amplifiers terminated with negative feedback, well known in the art of electronic design, the temperature dependence of the gain and its frequency response have very weak or negligible effect on the overall control ability of the feedback loop. The intensity of the beam received by the detector 308 is converted to current 310, which is then fed into the inverting input of the differential amplifier 312. A reference current source 311 is fed into the non-inverting input of the differential amplifier 312. The amplifier output drives current into the LED. The light-output from the LED $P_L$ is given as approximately proportional to the drive current $I_{LED}$: $P_L=I_{LED}/S_{LED}(I_{LED})$. The LED output efficiency is $1/S_{LED}$ [W/A], once we close the feedback loop, we can express the output power as, $$P_{OUT} = \frac{I_{REF}}{S_{PD}(R_{TE}\sin^2\phi_D + R_{TM}\cos^2\phi_D) + S_{LED}/G}\left(\frac{T_{TE}+T_{TM}}{2}\right) \quad (1)$$

All of the elements of the optical source 300 are temperature and wavelength dependent: The reference current $I_{REF}$, the detector responsivity $S_{PD}$, the gain G of the amplifier may be low and temperature dependent, and the LED efficiency $S_{LED}$ which is dependent on the current flowing through the LED due to droop, heating, and coupling losses. Finally, the peak emission wavelength $\lambda_m$ of the LED moves with temperature with a typical linear coefficient $d\lambda_m/dT$, all of which make the entire system shown in 300 temperature dependent: $P_{OUT}(T, \phi_D)$.

In order to compensate for these changes, a second-level compensation comprises in designing an optical interference coating (resulting in specific T and R in equation (1)) that will make the transmittivity and reflectivity on the beam splitter 302 vary exactly in the opposite direction and reduce the temperature variations over temperature. This second-level temperature compensation is possible, but does not lend itself to efficient manufacturing because the component characteristics vary in manufacturing (including the interference coating 320) and it becomes next to impossible to obtain the same response every time the optical source is built. In one embodiment, polarizing interference coating 320 is designed so that it produces an output intensity variation with temperature that has opposite signs for the two orthogonal states of rotating polarizer 306. In another embodiment, a polarization direction (or angle) of rotating polarizer 306 is operatively configured to be adjusted in order to minimize the output intensity variation with temperature. The adjustment may be performed at manufacturing time. In this way, the effect of manufacturing variances is corrected at the last stage of manufacturing, resulting in higher stability optical source.

In one embodiment, the coating on the beam splitter 302 is designed so that the product of the temperature coefficient $(dP_{OUT}(\phi_D=\phi_0)/dT)$ of the output intensity measured when the polarization angle is set to $\phi_D=\phi_0$, and the temperature coefficient $(dP_{OUT}(\phi_D=\phi_0+\pi/2)/dT)$ of the output intensity when the polarization angle is set to $\phi_0+\pi/2$ is less than zero. In other words, the output beam intensity temperature coefficients have to have opposite slopes for the two detector polarization angle settings throughout the temperature range. Since the reference for $\phi_D$ can be set arbitrarily, we set the reference to zero, i.e., $\phi_0=0$, and write this condition as:

$$\frac{dP_{OUT}(\phi_D=0)}{dT} \cdot \frac{dP_{OUT}(\phi_D=\pi/2)}{dT} < 0 \quad (2)$$

Once the optical source is equipped with this type of interference coating, at the end of the manufacturing, the angle $\phi_D$ is adjusted either manually or electronically to make the output beam intensity have a temperature coefficient within some desired range. One can see that this is possible, because in one case the output increases with increasing temperature and on the other it decreases with increasing temperature. This means that the detector polarization angle is adjusted to an optimal value $\phi_D(\text{opt})$ so that $$\left|\frac{dP_{OUT}(\phi_D(\text{opt}))}{dT}\right| = \min \quad (3)$$

One embodiment of a control circuit 350 for Embodiment A is shown in FIG. 3B. The current $I_{LED}$ flowing through the LED produces unpolarized light that is incident on the beam splitter 302 and then on the polarizing beam splitter 306. The current $I_D$ is generated by the photodetector D1. FIG. 3B shows two amplifier stages delineated with dash-line boxes: differential transimpedance amplifier stage 351 and LED driver stage 352. The transimpedance amplifier $A_1$ amplifies the difference between the photodetector current $I_D$ and an externally adjustable reference current $I_{REF}$. The objective of the differential transimpedance amplifier is to amplify the difference in currents rather than the difference in voltages because the photodetector generates current proportionally to the optical power received. Voltage and current references with high temperature stability are available commercially from, for example, MAXIM Integrated and Linear Technologies, Inc., USA. Clearly, the reference source may be realized by using a voltage reference and precision resistors or other means known in the art, and the current from the photodiode may be converted to voltage at a precision temperature-stable resistor. The output from the stage 351 is voltage $V_1$ given by $V_1=R_3 I_{REF}-R_1 I_D$, where $R_1$ and $R_3$ are precision resistors. It is essential that the resistors $R_1$ and $R_3$ are matched in value and have low temperature coefficients. Precision resistors suitable for this and such purposes are available commercially for use in strain gauges from Vishay Precision Group, Malvern, Pa. 19355, USA; their absolute resistance and temperature coefficients are better than 0.01% and +20 ppm/° C. Using these resistors, the set value of $I_{REF}$ determines the target optical power in the exit beam 303.

The output of the differential transimpedance amplifier $A_1$ is connected to the driver amplifier 352: The voltage $V_1$ is amplified to drive the light-source (LED): $I_{LED}=G\{R_3 I_{REF}-R_1 I_D\}$, where G is the transconductance gain of the last stage 352 which comprises operational amplifier $A_3$, resistors $R_6$ and $R_7$, and an optional driver transistor $T_3$ all configured to control the current $I_{LED}$ through the light-emitting diode 301. The driver amplifier circuit 350 shown in FIG. 3B is a non-limiting example. It is clear that the differential transimpedance amplifier A1 may be realized as a differential voltage amplifier if the photodetector D1 current $I_D$ is converted to voltage and that voltage is compared to a reference temperature stable voltage source (VREF) rather than a temperature stable current source.

Finally, to illustrate the functional dependence of the control and the detector polarization angle, we let the amplifier gain become infinitely large to arrive at the expression for output power as $$P_{OUT} = \frac{I_{REF}}{2} \cdot H(\phi_D) \text{ where} \quad (4)$$

$$H(\phi_D) = \frac{1}{S_{PD}} \cdot \frac{F_{TE}+F_{TM}+2 F_{TM} F_{TE}}{(1+F_{TE})\sin^2 \phi_D + (1+F_{TM})\cos^2 \phi_D}$$

The constraints on the composite functions $F_{TE}$ and $F_{TM}$, and the detector responsivity variation with temperature are then given by inserting (4) into (3).

II. Embodiment B

Electronic Analyzer

Figure 4A:
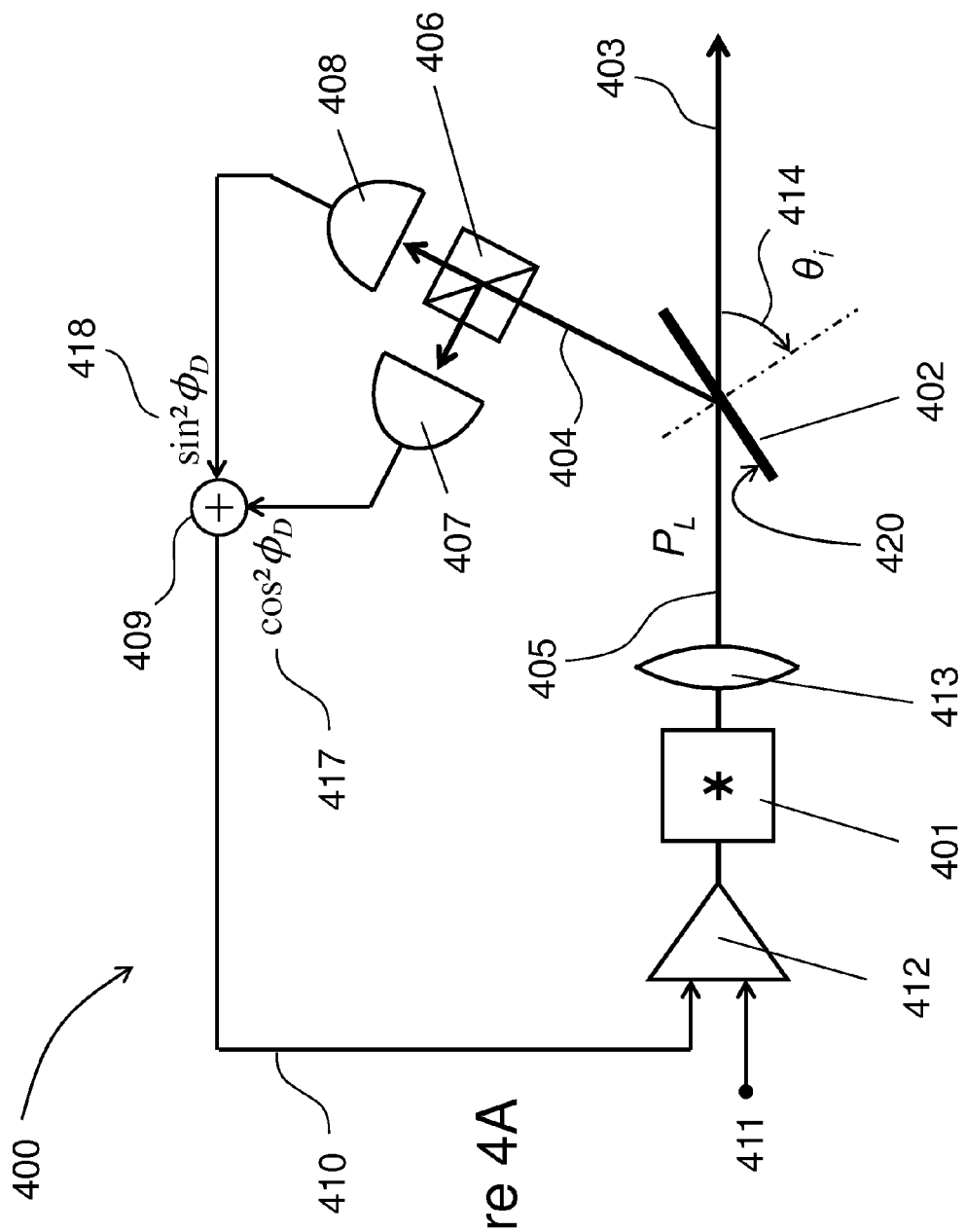
FIG. 4A: Embodiment B of the optical source using the present invention using a light-emitting diode.
Figure 4B:
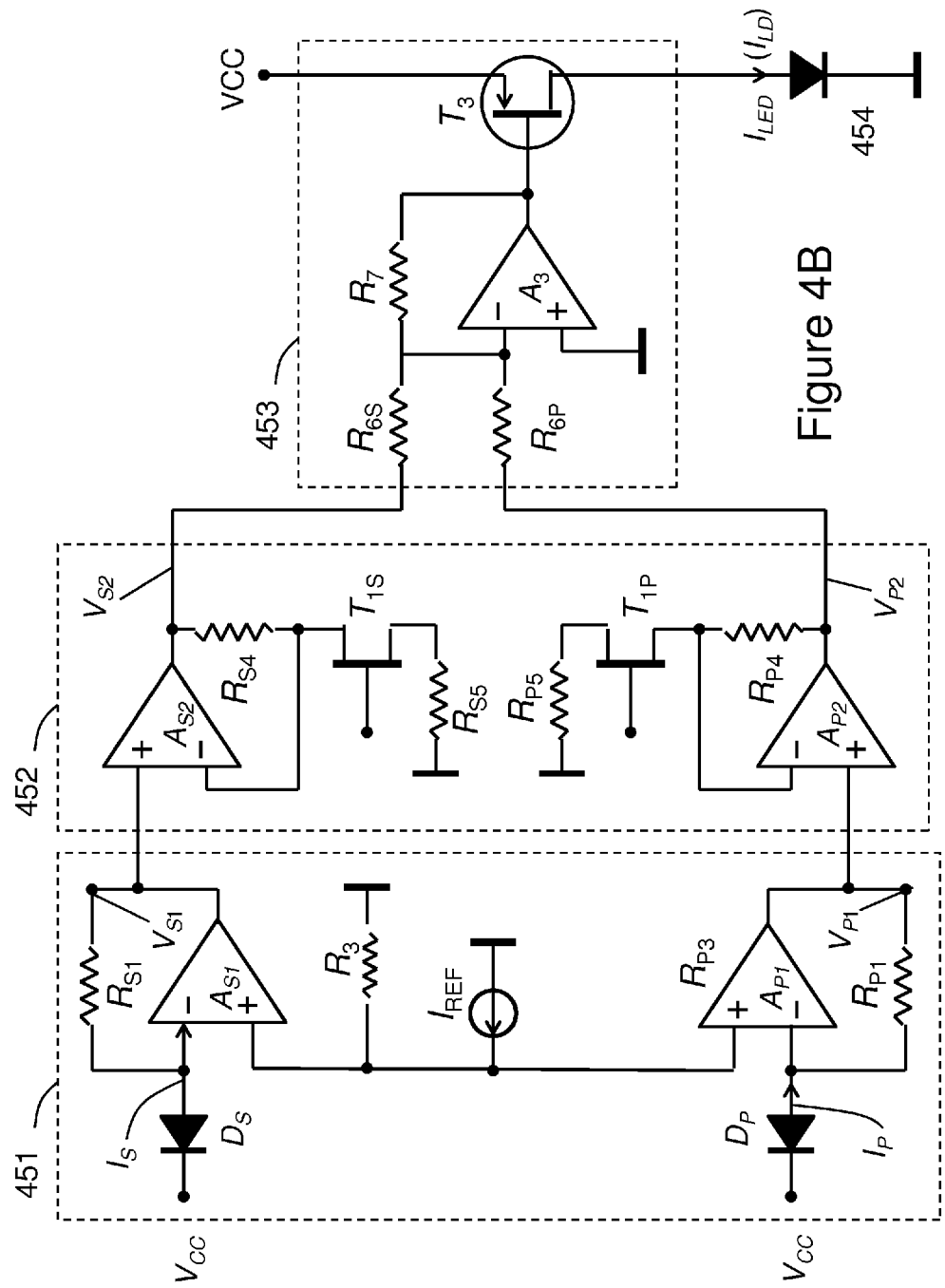
FIG. 4B: One embodiment of the optical-source control circuit for Embodiments B and C.

Embodiments of a temperature-stable incoherent optical source with an electronic analyzer and a method to stabilize an incoherent optical source are disclosed with the help of FIGS. 4A and 4B. Optical source 400 comprises light-emitting diode 401, first beam splitter 402, second beam splitter 406, two monitor photodiodes 407 and 408, and light-emitting diode driver circuit 412 configured as a differential amplifier with the weighted current output 410 from photodiodes 407 and 408 and a reference current input 411 connected to the differential amplifier 412 inputs, and the output from amplifier 412 driving light-emitting diode 401. The light emitted from light-emitting diode 401 is collimated using an optional collimator lens or lenses 413 and is incident on first beam splitter 402. The surface of the first beam splitter is coated with an interference coating 420.

The intensity of the light 405 incident on the first beam splitter 402 is denoted with $P_L$. The angle of incidence 414 ($\theta_i$) of the beam 405 onto the first beam splitter 402 may take any value and is established by design prior to manufacturing. The first beam splitter 402 is characterized by its reflectivity (R) and transmission (T) spectra versus wavelength (and versus temperature, if needed) at specific incidence angle $\theta_i$ for TE and TM: the transmission ($T_{TE}$, $T_{TM}$) and reflectivity ($R_{TE}$, $R_{TM}$) versus wavelength. Transmission (or transmittivity) and reflectivity are defined as above in Embodiment A. The angle of incidence $\theta_i$ has to be adjusted at manufacturing time so that reflected light is captured by the detectors 407 and 408, hence the position of the detectors 407 and 408 and the second beam splitter 406 will be adjusted accordingly. The beam splitter 402 is coated with an interference coating 420 on the side that faces the light-emitting diode 401 so that the light beam 405 hits the interference coating 420 first; that side of the beam splitter is referred to as the incidence surface. In one embodiment, the back side, i.e., the side on which the transmitted beam exits, the beam splitter is coated for reduced light reflectivity, i.e., with an anti-reflective coating, while in another embodiment the back surface of the beam splitter 402 is positioned at an acute angle relative to the incidence surface so no light reflected on that back surface interferes with the reflected beam 404. In yet another embodiment, the back surface is positioned at an acute angle relative to the incidence surface so that the exiting light 403 traverses the back surface at normal incidence. In another embodiment, the back surface is coated using an interference coating that exhibits transmission coefficient that varies with wavelength and the wavelength-dependent transmission of the coating is designed to assist in the temperature compensation.

The composite functions $F_{TE}$ and $F_{TM}$ versus wavelength are formed from the ratios of the transmitivity to reflectivity for TE and TM polarization as $F_{TE}=T_{TE}/R_{TE}$ and $F_{TM}=T_{TM}/R_{TM}$. The composite functions $F_{TE}$ and $F_{TM}$ define the optical characteristics of the first beam splitter coated with the interference coating and are generally functions of wavelength, angle of incidence $\theta_i$, and temperature T.

Using these definitions, the intensity of output beam 403 is given with $P_{OUT}=P_L\cdot(T_{TE}+T_{TM})/2$. The useful output light 403 is the portion of LED-emitted light beam 405 which is transmitted through the first beam splitter 402, while the rest of the incident beam 405 is reflected on the first beam splitter 402, and split by the second beam splitter 406 into two beams, each of which is captured by one of the detectors 407 and 408. The second beam splitter 406 has a high polarization discrimination ratio. The beam 405 is generally unpolarized, the reflected beam 404 is weakly polarized by the first beam splitter 402, while the two beams incident on the detectors are polarized orthogonally. One of the detectors 407 hence measures the TE polarized component of the reflected beam 404 and converts it to electrical current with responsivity $S_{TE}$, while the other detector 408 measures the TM component and converts it to current with responsivity $S_{TM}$. Clearly, what polarization component each detector captures depends on how the second beam splitter 406 is oriented, hence either combination is possible. It is desirable that the responsivities $S_{TE}$ and $S_{TM}$ be as close as possible, but in general, due to manufacturing variances they will be slightly different. This will be accounted for in the analysis of the stability of the disclosed optical source presented below. The currents output from the detectors are weighted and then added in element 409. The weighing factors are expressed as a function of an effective detector polarization angle $\phi_D$ as $\cos^2 \phi_D$ and $\sin^2 \phi_D$ for TM and TE contributions as shown in FIG. 4A In FIG. 4A, the weighting and adding functionality are indicated by labels/elements 417, 418, and 409, but clearly the actual circuit implementation may vary as is well known in the art. In one embodiment, the unweighted currents from detectors 407 and 408 are first compared with reference 411 and the differences in currents (voltages) are weighted and added. This embodiment will be disclosed in more detail with the help of FIG. 4B.

The differential amplifier 412 exhibits gain G. The current 410 is fed into the inverting input of differential amplifier 412. A reference current source 411 is fed into the non-inverting input of differential amplifier 412. The amplifier output drives current into LED 401. The light-output $P_L$ from the LED is given as approximately proportional to the drive current $I_{LED}$: $P_L = I_{LED}[S_{LED}(I_{LED})]$ where the LED output efficiency is $1/S_{LED}$ [W/A]. Once we close the feedback loop we can express the output power as, $$P_{OUT} = \frac{I_{REF}}{R_{TE}S_{TE}\sin^2\phi_D + R_{TM}S_{TM}\cos^2\phi_D + S_{LED}/G} \left(\frac{T_{TE} + T_{TM}}{2}\right) \quad (5)$$

All of the elements of the optical source 400 are temperature and wavelength dependent: The reference current $I_{REF}$, the amplifier gain G of the amplifier which may be low and temperature dependent, and the LED efficiency which is dependent on the current flowing through the LED due to droop, heating, and coupling losses. Finally, the peak emission wavelength $\lambda_m$ of the LED moves with temperature, which makes the entire system shown in 400 temperature dependent.

In one embodiment, the coating 420 on beam splitter 402 is designed so that the product of the temperature coefficient $(dP_{OUT}(\phi_D=0)/dT)$ of the output intensity measured when the polarization angle is zero $(\phi_D=0)$ and the temperature coefficient $(dP_{OUT}(\phi_D=90°)/dT)$ of the output intensity when the polarization angle is set to $\phi_D=90°$ less than zero. In other words, the output beam intensity temperature coefficients have to have opposite slopes for the two detector polarization angle settings throughout the temperature range.

$$\frac{dP_{OUT}(\phi_D = 0)}{dT} \cdot \frac{dP_{OUT}(\phi_D = \pi/2)}{dt} < 0 \quad (6)$$

Note that the detector polarization angle is just a number that determines the weighting of the currents from the detectors via the sine and cosine functions.

At manufacturing time, the angle $\phi_D$ is adjusted either manually or electronically to make the output beam intensity have minimal or prescribed temperature coefficient.

$$\left|\frac{dP_{OUT}(\phi_D(opt))}{dT}\right| = \min \quad (7)$$

An embodiment of the control circuit for Embodiment B is illustrated in FIG. 4B. Still referring to FIG. 4A, the current flowing through the LED produces unpolarized light that is incident on the first beam splitter 402 and then on the polarizing beam splitter 406. In FIG. 4B, the current $I_S$ is generated by the photodetector $D_S$ and $I_P$ by the photodetector $D_P$. Furthermore, FIG. 4B shows three amplifier stages delineated with dash-line boxes: tandem differential transimpedance (TZ) amplifier stage 451, dual variable gain amplifier (VGA) stage 452, and adder and driver stage 453. The two detectors 407 and 408 from FIG. 4A are depicted as reverse biased photodiodes $D_S$ and $D_P$ in FIG. 4B. The current photogenerated in these two diodes is fed into the inverting inputs of the differential transimpedance amplifiers $A_{S1}$ and $A_{P1}$ resulting in voltages $V_{S1}$ and $V_{P1}$. The value of the resistor $R_3$ should be set to one half of $R_{S2}=R_{P2}$. Each of the transimpedance amplifiers $A_{S1}$ and $A_{P1}$ amplify the difference between the photodetector current ($I_S$ or $I_P$) and an adjustable reference current $I_{REF}$. The objective is to amplify the difference in currents rather than the difference in voltages because the photodetector generates current proportionally to the optical power received. Temperature-stable voltage and current references with high temperature stability are available commercially from, for example, MAXIM Integrated and Linear Technologies, Inc., USA. Clearly, the reference current source may be realized by using a voltage reference and precision resistors or other means known in the art. The two outputs from the stage 451 are voltages $V_{S1}$ and $V_{P1}$ given by $$V_{S1}=R_3 I_{REF}-R_{S1}-R_{S1}I_S \quad V_{P1}=R_3 I_{REF}-R_{P1}I_S \quad (8)$$

In the stage 452, the two voltages $V_{S1}$ and $V_{P1}$ are amplified independently and with controllable amount of gain by amplifiers $A_{S2}$ and $A_{P2}$, having total voltage gain $A_S$ and $A_P$. The key feature of the second stage (452) is that the ratio of the gains $A_S/A_P$ is controllable. This adjustment may be accomplished using dual gang potentiometers in the feedback of the amplifiers (not shown) where one potentiometer increases while the other decreases the resistance and thereby changing the gain of the amplifier or by controlling the voltage on the shown field-effect transistors $T_{1S}$ and $T_{1P}$ operated in the linear mode in such a way that the one increases and the other decreases the amplifier gain simultaneously. The voltages at the two outputs from stage 452 are then given by $$V_{S2}=A_S(R_3 I_{REF}-R_{S1}I_S) \quad V_{P2}=A_P(R_3 I_{REF}-R_{P1}I_S) \quad (9)$$

Finally, these two voltages are added and amplified in stage 453 to drive the light-source (LED) 454.

$$I_{LED}=G\{A_P(R_3 I_{REF}-R_{P1}I_P)+A_S(R_3 I_{REF}-R_{S1}I_S)\} \quad (10)$$

where G is the transconductance gain of the last stage 453. The resistors $R_{6S}$, $R_{6P}$, $R_7$, and transistor $T_3$ are shown as an exemplary implementation of the last stage. It is essential that the resistors $R_{S1}$, $R_{P1}$, and $R_3$ are matched in value and have low temperature coefficient. In this way, it is the set value of $I_{REF}$ that determines the target output power. Making that assumption, the output current comes out to be $$\frac{I_{LED}}{GR_3} = (A_P + A_S)I_{REF} - A_P I_P - A_S I_S \quad (11)$$

The light emitted by LED 401 is passed through weakly polarizing interference coating 420. The received light on the detectors generates currents given by $$I_P = \frac{S_{TE}R_{TE}}{S_{LED}}I_{LED} \quad I_M = \frac{S_{TM}R_{TM}}{S_{LED}}I_{LED} \quad (12A)$$

$$P_{OUT} = \frac{I_{LED}}{2S_{LED}}(T_{TE} + T_{TM}) \quad (12B)$$

Combining these relationships we finally have the expression for output power as $$P_{OUT} = \frac{T_{TE} + T_{TM}}{2} \frac{I_{REF}}{\frac{S_{LED}}{GR_3} + \frac{A_P}{A_P + A_S} S_{TM} R_{TM} + \frac{A_S}{A_P + A_S} S_{TE} R_{TE}} \quad (13)$$

Clearly, if we make the transconductance gain very large (G>>1), we can obtain a relationship for the output power as $$P_{OUT} = \frac{I_{REF}}{2} \cdot H(\phi_D) \quad (14)$$

$$H(\phi_D) = \frac{F_{TE} + F_{TM} + 2F_{TM}F_{TE}}{(1 + F_{TE})S_{TM}\sin^2\phi_D + (1 + F_{TM})S_{TE}\cos^2\phi_D}$$

Here $A_P/A_S = \tan^2 \phi_D$. Clearly, by varying $A_P$ or $A_S$ and alternatively setting them to zero, we can access all detector polarization angles $0 \leq \phi_D \leq \pi/2$. Therefore, the circuit shown in FIG. 4B can be used to implement the temperature compensation scheme disclosed in embodiment B. It is clear that this is only one possible implementation of the control scheme for embodiment B, and that other circuit configurations, for example using reference voltage source rather than a current source and changing the tandem differential TZ amplifier accordingly, are possible. Additionally, one could use a digital control loop without departing from the spirit of the invention.

III. Embodiment C

Laser or Polarized Source with Electronic Analyzer

Figure 5:
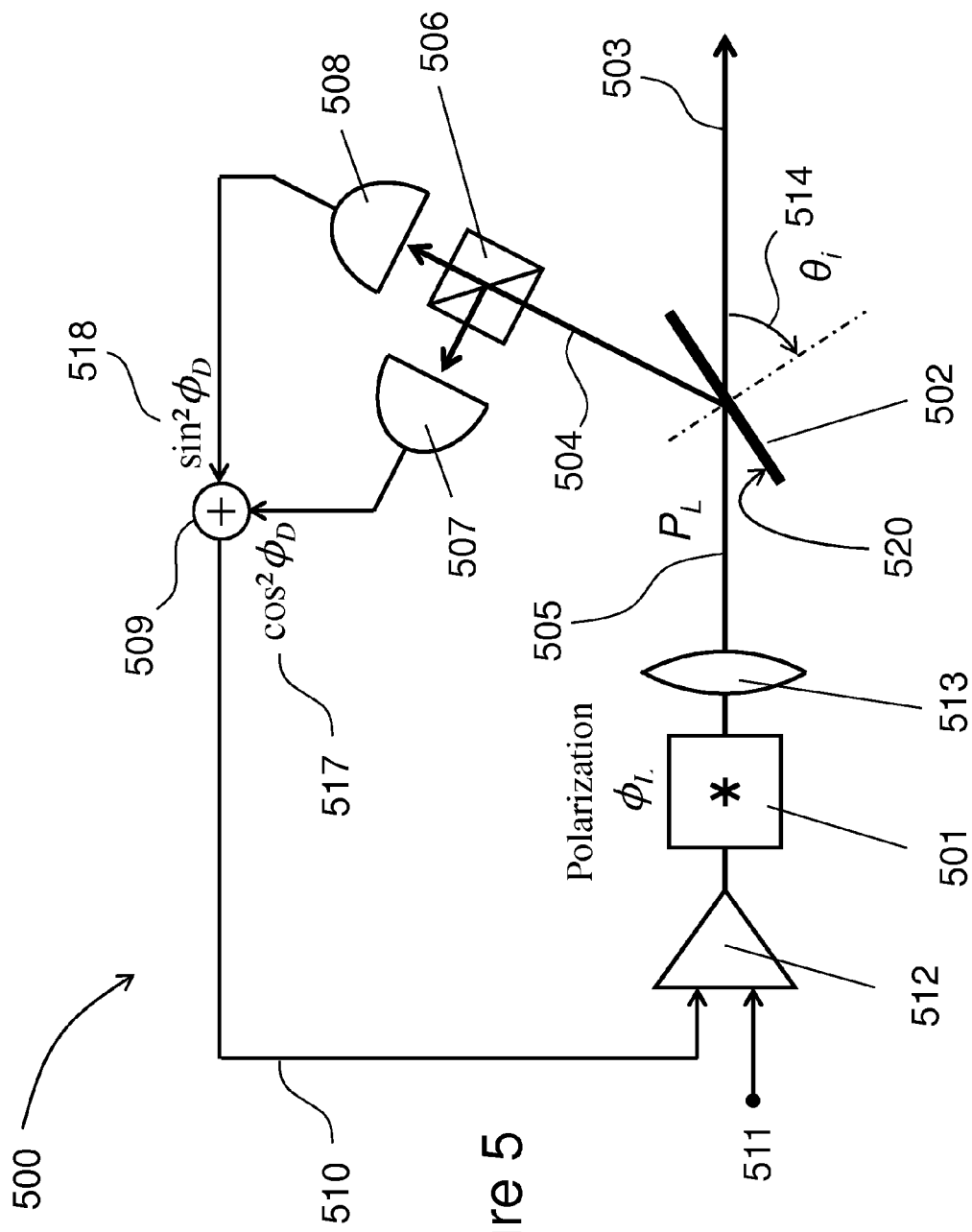
FIG. 5: Embodiment C of the optical source using the present invention using a laser.

Embodiments of a temperature-stable polarized optical source and a method to stabilize a polarized optical source are disclosed with the help of FIG. 5. FIG. 5 is identical to FIG. 4A, with the exception that it uses a laser 501 rather than a light-emitting diode 401. In one embodiment, the laser may be replaced with a light-emitting diode and a polarizer in front of it so the light emitted by the light-emitting-diode-polarizer assembly is polarized. In either case, the light reaching beam splitter 502 is polarized and the mathematical treatment shown below applies to both cases.

An optical source 500 comprises of a linearly polarized laser 501, first beam splitter 502, second beam splitter 506, two monitor photodiodes 507 and 508, and laser driver circuit 512 configured as a differential amplifier with the weighted current output 510 from photodiodes 507 and 508 and a reference current input 511 connected to the inputs of differential amplifier 512 and the output of amplifier 512 driving laser 501. The light emitted from laser 501 is collimated using an optional collimator lens 513 and is incident on first beam splitter 502. The surface of the first beam splitter is coated with an interference coating 520, this surface is also referred to as the incidence surface. The plane of incidence of the beam splitter 502 is defined as the plane that is parallel to the light beam 505 emitted from the laser 501 and perpendicular to the incidence surface of the beam splitter 502.

The light beam 505 emitted from the laser 501 is linearly polarized with the electric field vector closing an angle $\phi_L$ with the plane of incidence of first beam splitter 502. The intensity of the light beam 505 incident on the first beam splitter 502 is denoted with $P_L$. The angle of incidence 514 (Of) of the light beam 505 onto the first beam splitter 502 may take any value and is established by design prior to manufacturing. The first beam splitter 502 is characterized by its reflectivity (R) and transmission (T) spectra versus wavelength (and versus temperature, if needed) at specific incidence angle $\theta_i$ for TE and TM: the transmission ($T_{TE}$, $T_{TM}$) and reflectivity ($R_{TE}$, $R_{TM}$) versus wavelength. Transmittivity and reflectivity are defined as above in the section on Embodiment A. Composite functions $F_{TE}$ and $F_{TM}$ versus wavelength are formed from the ratios of the transmitivity to reflectivity for TE and TM polarization as $F_{TE} = T_{TE}/R_{TE}$ and $F_{TM} = T_{TM}/R_{TM}$. The composite functions $F_{TE}$ and $F_{TM}$ define the optical characteristics of the first beam splitter coated with the interference coating and are generally functions of wavelength, angle of incidence $\theta_i$, and temperature T.

Using these definitions, the output beam 503 intensity is given with $P_{OUT} = P_L(T_{TE}\sin^2\phi_L + T_{TM}\cos^2\phi_L)/2$. A portion 503 of the laser-emitted light beam 505 is transmitted through the first beam splitter and becomes useful output light 503, while the rest of the incident beam 505 is reflected on the first beam splitter 502, and split by the second beam splitter 506 into two beams, each of which is captured by one of the detectors 507 and 508. The second beam splitter 506 has a high polarization discrimination ratio. The beam 505 is linearly polarized, the reflected beam 504 is generally elliptically polarized by the first beam splitter 502, while the two beams incident on the detectors are polarized orthogonally. One of the detectors 507 hence measures the TE polarized component of the reflected beam 504 and converts it to electrical current with responsivity $S_{TE}$, while the other detector 508 measures the TM component and converts it to current with responsivity $S_{TM}$. Clearly, what component each detector captures depends on how the second beam splitter 506 is oriented, hence either combination is possible. It is desirable that the responsivities $S_{TE}$ and $S_{TM}$ be as close as possible, but in general, due to manufacturing variances they will be slightly different. This will be accounted for in the analysis of the stability of disclosed optical source in later text. The currents output from the detectors are weighted and then added in element 509. The weighing factors are expressed as a function of an effective detector polarization angle $\phi_D$ as $\cos^2 \phi_D$ and $\sin^2 \phi_D$ for TM and TE contributions. The weighting and adding functionality are shown with elements/labels 517, 518, and 509 in FIG. 5 are illustrated as functions, but clearly their actual circuit implementation may vary. For example, the adding can be implemented as a part of the differential amplifier circuit similar to the one shown in FIG. 4B, while the weighting may be implemented using adjustable potentiometers, using field-effect transistors operated in linear mode, or using digital electronics where the currents from the detectors first have to converted to digital format and then processed in a microprocessor. The output beam intensity becomes, $$P_{OUT} = \frac{I_{REF}(T_{TE}\sin^2\phi_L + T_{TM}\cos^2\phi_L)}{R_{TE}S_{TE}\sin^2\phi_L\sin^2\phi_D + R_{TM}S_{TM}\cos^2\phi_L\cos^2\phi_D + S_{LED}/G} \quad (15)$$

The circuit shown in FIG. 4B is a non-limiting example of a circuit that can also be used to control the optical source of Embodiment C. Embodiment C which uses a laser assumes that the laser will be mounted relative to the first beam splitter incidence plane at manufacturing time to a specific angle. Clearly, if this angle is 45°, then mathematically, relationship (9) will allow functionally the same advantages as the control of Embodiment B, since $\cos^2$ $\phi_L = \sin^2 \phi_L$. However, it is visible from equation (15) that embodiment C offers one additional advantage over embodiment B: The laser angle $\phi_L$ may be designed to weigh the importance of TE versus TM properties of the first beam coating 520. This weighting is visible in equation (15) by the appearance of products $R_{TE} \sin^2 \phi_L$ and $R_{TE} \cos^2 \phi_L$. This specific advantage becomes very useful when the ratio of the TE and TM transmission (and reflection) on the beamsplitter coating needs to be adjusted in magnitude. Note, however, that setting the laser angle $\phi_L$ to zero or 90° removes the possibility of using polarization to track the changes in temperature, namely, the photodetector angle $\phi_D$ cannot be used to compensate for the temperature dependence of the optical source intensity.

All of the elements of optical source 500 are temperature and wavelength dependent: reference current $I_{REF}$, the amplifier gain G which may be low and temperature dependent, and the laser efficiency which is dependent on the current flowing through the laser due to heating and coupling losses. Finally, the peak emission wavelength $\lambda_m$ drift and the polarization drift of the laser move with temperature, which makes the entire system shown in 500 temperature dependent.

In one embodiment, the coating 520 on the beam splitter 502 is designed so that the product of the temperature coefficient of the output intensity measured when the polarization angle is zero $dP_{OUT} (\phi_D=0)/dT$ and the temperature coefficient of the output intensity when the photodetector polarization angle $\phi_D$ is set to 90 degrees $dP_{OUT}(\phi_D=90°)/dT$ is less than zero. In other words, the output beam intensity temperature coefficients have to have opposite slopes for the two detector polarization angle settings throughout the temperature range.

$$\frac{dP_{OUT}(\phi_D = 0)}{dT} \cdot \frac{dP_{OUT}(\phi_D = \pi/2)}{dT} < 0 \tag{16}$$

At manufacturing time, the angle $\phi_D$ is adjusted either manually or electronically to make the output beam intensity have a temperature coefficient within some desired range.

$$\left| \frac{dP_{OUT}(\phi_D(opt))}{dT} \right| = \min \tag{17}$$

The circuit shown in FIG. 4B also represents the Embodiment C. The current flowing through the laser $I_{LD}$ (in FIG. 4B) produces linearly polarized light that is incident on the beam splitter and is then split on the polarizing beam splitter. The current $I_S$ is generated by the TE photodetector and $I_P$ by the TM photodetector. FIG. 4B shows three amplifier stages delineated with dash-line boxes: tandem differential transimpedance amplifier stage 451, tandem variable gain amplifier stage 452, and adder and driver stage 453. Each of the transimpedance amplifiers $A_{S1}$ and $A_{P1}$ amplify the difference between the photodetector current ($I_S$ or $I_P$) and an adjustable reference current $I_{REF}$. The objective is to amplify the difference in currents rather than the difference in voltages because the photodetector generates current proportionally to the optical power received. Temperature-stable voltage and current references with high temperature stability are available commercially from, for example, MAXIM Integrated and Linear Technologies, Inc., USA. Clearly, the reference current source may be realized by using a voltage reference and precision resistors or other means known in the art. The two outputs from stage 451 are voltages $V_{S1}$ and $V_{P1}$ given by $$V_{S1} = R_3 I_{REF} - R_{S1} I_S \quad V_{P1} = R_3 I_{REF} - R_{P1} I_S \tag{18}$$

In the stage 452, the two voltages $V_{S1}$ and $V_{P1}$ are amplified independently and with controllable amount of gain: Amplifier $A_{S2}$ and $A_{P2}$ having total voltage gain $A_S$ and $A_P$. The key feature of the second stage (452) is that the ratio of the gains $A_S/A_P$ is controllable. This may be accomplished using dual gang potentiometers in the feedback of the amplifiers where one potentiometer increases while the other decreases the resistance and thereby changing the gain of the amplifier or by controlling the voltage on the shown field-effect transistors $T_{1S}$ and $T_{1P}$ operated in the linear mode in such a way the one increases and the other decreases the amplifier gain simultaneously. The voltages at the two outputs from the stage 452 are then given by $$V_{S2} = A_S(R_3 I_{REF} - R_{S1} I_S) V_{P2} = A_P(R_3 I_{REF} - R_{P1} I_S) \tag{19}$$

Finally, the two voltages are added and amplified in stage 453 to drive the laser diode (LD) 454.

$$I_{LD} = G\{A_P(R_3 I_{REF} - R_{P1} I_P) + A_S(R_3 I_{REF} - R_{S1} I_S)\} \tag{20}$$

where G is the transconductance gain of the last stage 453. It is essential that the resistors $R_{S1}$, $R_{P1}$, and $R_3$ are matched in value and have low temperature coefficient. In this way, it is the set value of $I_{REF}$ that determines the target output power. Making that assumption, the output current comes out to be $$\frac{I_{LD}}{GR_3} = (A_P + A_S)I_{REF} - A_P I_P - A_S I_S \tag{21}$$

The light emitted by laser 401 is passed through weakly polarizing interference coating 520. The received light on the detectors is then given by $$I_P = \frac{S_{TE} R_{TE}}{S_{LD}} I_{LD} \cos^2 \phi_L \quad I_M = \frac{S_{TM} R_{TM}}{S_{LD}} I_{LD} \sin^2 \phi_L \tag{22A}$$

$$P_{OUT} = \frac{I_{LD}}{2 S_{LD}} (T_{TE} \cos^2 \phi_L + T_{TM} \sin^2 \phi_L) \tag{22B}$$

Combining these relationships we finally have the expression for output power as $$P_{OUT} = I_{REF} \frac{T_{TE} \cos^2 \phi_L + T_{TM} \sin^2 \phi_L}{\frac{S_{LD}}{GR_3} + \frac{A_P}{A_P + A_S} S_{TM} R_{TM} \sin^2 \phi_L + \frac{A_S}{A_P + A_S} S_{TE} R_{TE} \cos^2 \phi_L} \tag{23}$$

Clearly, if we make the transconductance gain very large (G>>1), we can obtain a straightforward relationship for the output power as $$P_{OUT} = I_{REF} H(\phi_L, \phi_D) \tag{24}$$

where $$H(\phi_L, \phi_D) = \cfrac{1}{\cfrac{S_{TM}\sin^2\phi_D}{F_{TM} + \cfrac{F_{TE}}{\tan^2\phi_L}\left(\cfrac{1+F_{TM}}{1+F_{TE}}\right)} + \cfrac{S_{TE}\cos^2\phi_D}{F_{TE} + F_{TM}\tan^2\phi_L\left(\cfrac{1+F_{TE}}{1+F_{TM}}\right)}}$$

Here $A_P/A_S = \tan^2 \phi_D$. Clearly, by varying $A_P$ or $A_S$ and alternatively setting them to zero, we can access all detector polarization angles $0 \leq \phi_D \leq \pi/2$. This can be done at the end of the manufacturing electronically. Setting of the laser angle $0 < \phi_L < \pi/2$ is done by design.

It is clear that this is only one possible implementation of the control scheme for embodiment C, and that other circuit configurations, for example, using a reference voltage source rather than a current source, and using a digital control loop are also possible without departing from the spirit of the invention.

IV. Interference Coating on First Beam Splitter

The principle of temperature stabilization of a light source disclosed in Embodiments A, B, and C, will be illustrated with the help of FIGS. 4A, 9A, 9B, and 9C, for the case when the light emitter is unpolarized (Embodiment B), but the design principles for A and C are basically the same.

Figure 9:
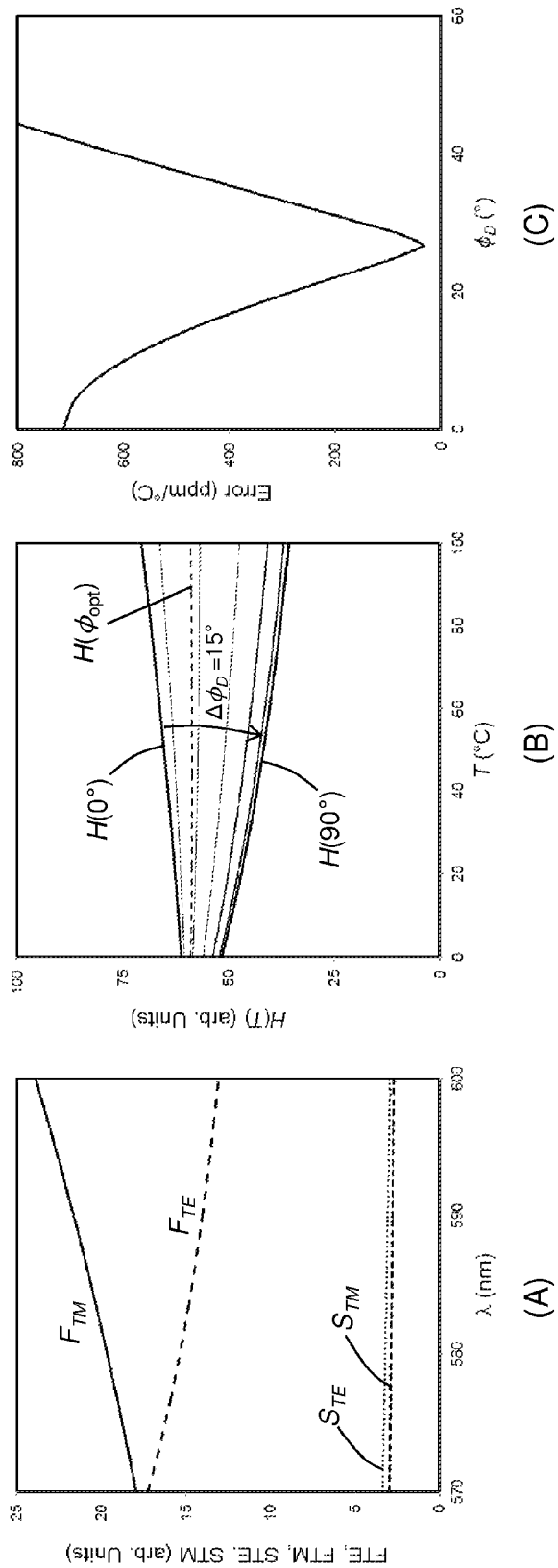
FIG. 9A: Exemplary composite functions F and detector responsivities S as a function of temperature.
FIG. 9B: Computed function H as a function of temperature.
FIG. 9C: Resulting control error.

The interference coating 420 is designed for specified angle of incidence 414. The composite functions $F_{TE}$ and $F_{TM}$ for this hypothetical coating are illustrated in FIG. 9A along with hypothetical temperature variation of the detector responsivities ($S_{TE}$ and $S_{TM}$) for the two detectors are shown versus wavelength in FIG. 9A. Note that the slopes are different on all the curves. In order to predict the output power variation with temperature, we need to convert the wavelength variation to temperature variation, and account for the fact that the detector responsivities are also temperature dependent. The resulting function $H(T,\phi_D)$ is illustrated in FIG. 9B for values of $\phi_D=0$, 15, 30, 45, 60, 75, and 90 degrees. The extreme values are for $\phi_D=0$ and 90 degrees. As one varies the detector polarization angle $\phi_D$ and computes the optical source temperature stability error, one can see in FIG. 9C that there is a value for which the error is at a minimum. In one embodiment, this is the global optimal detector polarization angle one sets and locks for the life of the optical source.

V. Beam Splitter Designs

Embodiment BS1

As shown in FIGS. 3A, 4A, and 5, in one embodiment the weakly polarizing beam splitters 302, 402, and 502 are realized as single-plate polarizers coated on one side with an interference coating 320, 420, or 520. In other embodiments, both sides of the plates 302, 402, 502 are coated with interference coatings: The incident surfaces 320, 420, 520 are weakly polarizing, while the back (opposite) surfaces of the plate are coated with an anti-reflective coating. In yet another embodiment, the back surface is coated with another weakly polarizing coating so that the coating on the front and the back of the slab beam-splitter is combined, and the desired wavelength dependence of R and T is achieved.

Embodiment BS2

Figure 10:
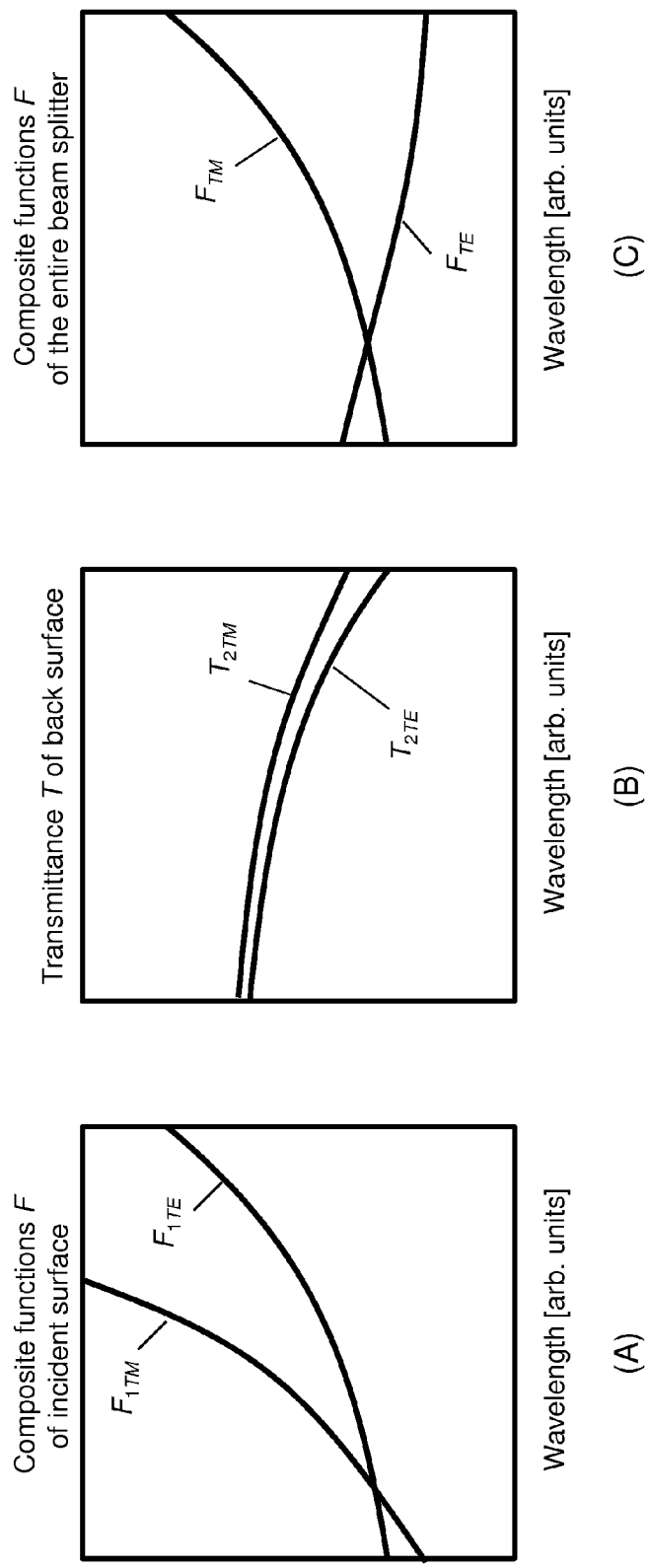
FIG. 10: Illustration used to explain embodiments BS2, BS3, and BS4. (A) Exemplary composite functions $F_1$ for incidence surface of one embodiment of the weakly-polarizing beam splitter, (B) Exemplary transmittances $T_2$ for back surface of one embodiment of the weakly-polarizing beam splitter, and (C) resulting composite functions F for the entire beam splitter.

In one embodiment, illustrated with the help of FIG. 8A, the first beam splitter 804 is a prism where the incidence surface 820 and the back surface 821 are coated with different weakly-polarizing interference coatings, both designed for oblique incidence, but with different wavelength and polarizing properties. The light 803 coming from the light-emitting diode or laser is reflected on incident surface 820 and directed to beam splitter 814 that discriminates the polarization into two orthogonally polarized beams 806 and 807 as described previously in FIG. 4A. The coating 820 on the incidence surface 820 may be designed with one polarization discrimination and one type of wavelength dependence, while the coating 821 on the back surface may be made with second polarization and wavelength dependence that is different from the first one. This embodiment (using two more than one interference coating) is further explained with the help of FIG. 10 and FIG. 8A, where FIG. 10A shows exemplary composite functions $F_{TE}$ and $F_{TM}$ versus wavelength for the coating 820 disposed on the incidence surface of beam splitter 804 or equivalent. FIG. 10B shows exemplary transmittances $T_{TE}$ and $T_{TM}$ versus wavelength of the coating 821 disposed on the back surface of the beam splitter 804 or equivalent. It is clear that the composite functions of the coating 820 on the incidence surface exhibit different slopes in the wavelength range of interest, but both slopes are positive. If one were to use the coating shown in FIG. 10A by itself in Embodiments A, B, or C, the temperature dependence of the output light intensity would generally not satisfy the requirement described with equation (2) (same as equation (6) and (16)). However, the coating 821 designed for the back surface of the beam splitter exhibits negative slopes in the transmittance spectra and also exhibit relatively weak polarization dependence. It is straightforward to show that the composite functions of the entire beam splitter 804 (or equivalent) include the effects of both coatings (FIG. 10A and FIG. 10B) via, $$F_{TE} = F_{1TE}F_{2TE} \quad F_{TM} = R_{1TM}T_{2TM} \tag{25}$$

where the subscript 1 refers to the incidence surface and subscript 2 to the back surface. The composite functions of the entire beam-splitter are shown illustratively in FIG. 10C and they clearly satisfy the optimal condition given with equations (2), (6), or (16). It is clear from expressions (25) that using two coatings (different on the incidence and on the back surface) the design of composite functions for the entire beam-splitter has acquired another degree of freedom. This is particularly important when the specific wavelength and temperature needs are such that obtaining the desired composite function slopes is difficult with one coating design. This embodiment allows the designer to use two simpler designs to accomplish an otherwise difficult wavelength-dependent characteristic. Namely, this embodiment has the advantage of independent control of reflection and transmission properties of the prism. Note that in FIG. 10, wavelength dependence translates to temperature dependence when an optical source with temperature dependent peak emission wavelength is used. Hence, the graphs may be viewed as having either wavelength or temperature on the horizontal axis.

Embodiment BS3

In another embodiment, the back surface of element 804 is designed for normal incidence so that the coating 821 on the back surface is non-polarizing and alters the transmission versus wavelength characteristics equally for both polarizations. This embodiment is not shown exactly in FIG. 10B, but can be envisioned if one imagines that the transmission characteristic of the back surface has no polarization dependence, namely, $T_{2TE}=T_{2TM}$ in FIG. 10B. In this way, only the incident surface coating provides weak polarization discrimination, while the second surface makes global temperature drift compensation. In the end, the coatings accomplish the desired temperature compensation properties given with equations (2), (6) or (16).

Embodiment BS4

In one embodiment, the first and the second beam splitters of FIGS. 4A and 5 are merged into one prism. This embodiment is explained with the help of FIG. 8B. Three-way beam splitter 850 performs two functions: it reflects a portion of the collimated beam 851 coming from a laser or a light-emitting diode as it impinges on the first surface 857 of the beam splitter 850 resulting in beam 860, it transmits the rest of the beam 852 and splits that beam into two beams on surface 856: the transmitted beam 853 and reflected beam 854 having orthogonal polarizations. The two beams 853 and 854 are captured by detectors 873 and 874, respectively. Besides reducing the number of optical components in the system, this embodiment allows each of the three sides of the beam splitter to be coated with a different optical interference coating. For example, a weakly polarizing coating 861 may be used at the first surface 857, a strongly polarizing coating 863 used at the second surface 856, and a non-polarizing coating 864 with a global wavelength dependence used at the third surface 855. The angles of the three-way prism can be designed to any values that suit the designer of the coatings and the mechanics of the optical source. In one embodiment, illustrated in FIG. 8B, one of the angles of the prism is a right angle and the smaller of the two other angles is adjusted so that two beams 853 and 854 exit the prism at right angles and one of the beams 854 exits normally from the surface 855. This would make the mechanical position of the detectors simpler and would ensure that the coating 864 on the third surface 855 is non-polarizing. The conditions for a right-angle design are given with the equation 878 in FIG. 8B, where the angles are also indicated. The refractive index of the prism is denoted with n.

VI. Method of Calibrating the Optical Source

Figure 7:
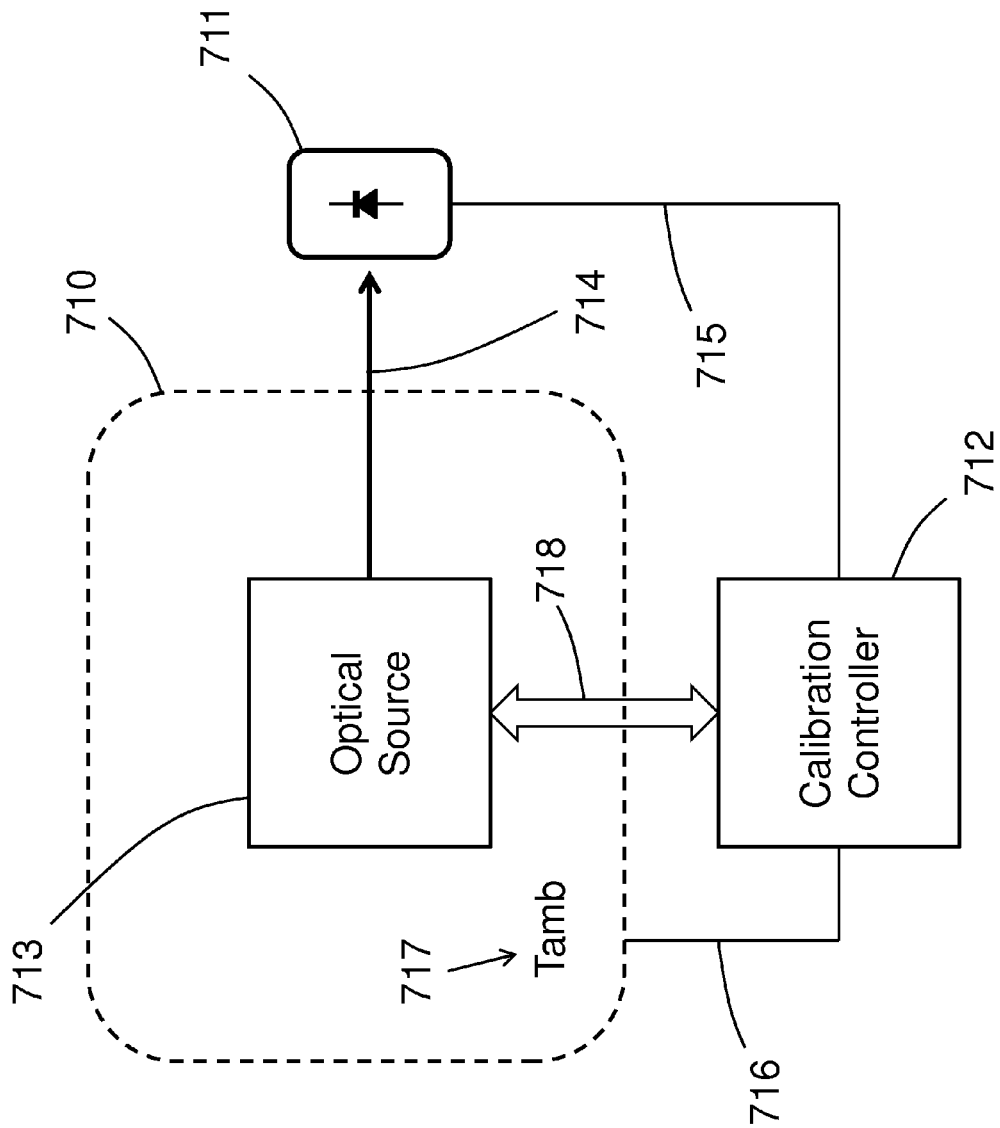
FIG. 7: Block diagram of a calibration system for optical source made according to the present invention.

The method of calibrating the optical source (at the manufacturing stage) disclosed in Embodiments A, B, and C is explained with the help of FIG. 7. In step 1, the optical source 713 is assembled and mounted onto a temperature controlled stage or oven 710. The optical source 713 is turned on and its output beam 714 is captured and measured using a standard calibrated photodetector 711 that preferably remains at constant temperature unrelated to the stage or the oven 710. The temperature 717 of the oven or the stage ("Tamb") is controlled using a calibration controller 712 which is essentially a computer or a microprocessor. The calibration controller 712 monitors the temperature of the oven or hotplate via link 716, makes readings of detected output power 714 via a link 715 to the calibrated photodetector 711, and controls the detector polarization angle within the optical source 713. In step 2, the temperature 717 of the oven 710 is gradually swept over the temperature range (from $T_1$ to $T_2$), and while the temperature is gradually increased through every temperature of interest, the detector polarization angle of the optical source 713, subject to control by the calibration controller 712, is varied from zero to 90°, and the output power 714 is noted. The power may be noted just for the two extreme values of the detector polarization angle (zero or 90°) or for a larger selection of angles in between and including the extreme values. The output power will approximately follow the relationship shown with equation (13) and the collected data may be used to fit the unknown variables of equation (13). In one embodiment of step 3, the data is used to determine the single detector polarization angle for which the output power (intensity) variation is at minimum. The selected detector polarization angle is referred to as the "global optimal detector polarization angle" $\phi_D(opt)$. The computed global optimal detector angle is stored in the memory of the optical source 713 by either (i) turning and fixing a potentiometer inside the optical source 713, or by (ii) storing the angle value in a computer memory inside the optical source 713 and using a microprocessor or any other means known in the art to hold the voltage fixed on the dual variable gain amplifiers. The purpose of both approaches (i) and (ii) is to hold fixed the ratio of $A_P/A_S$. In another embodiment of step 3, a specific value of output power is selected and an optimal $\phi_D$ is found during the calibration procedure for every temperature so that the overall output power remains constant. In this embodiment, the output power variation is further minimized relative to the stability achievable with setting only the global detector polarization angle.

VII. Entire Optical-Source Subsystem

Figure 6:
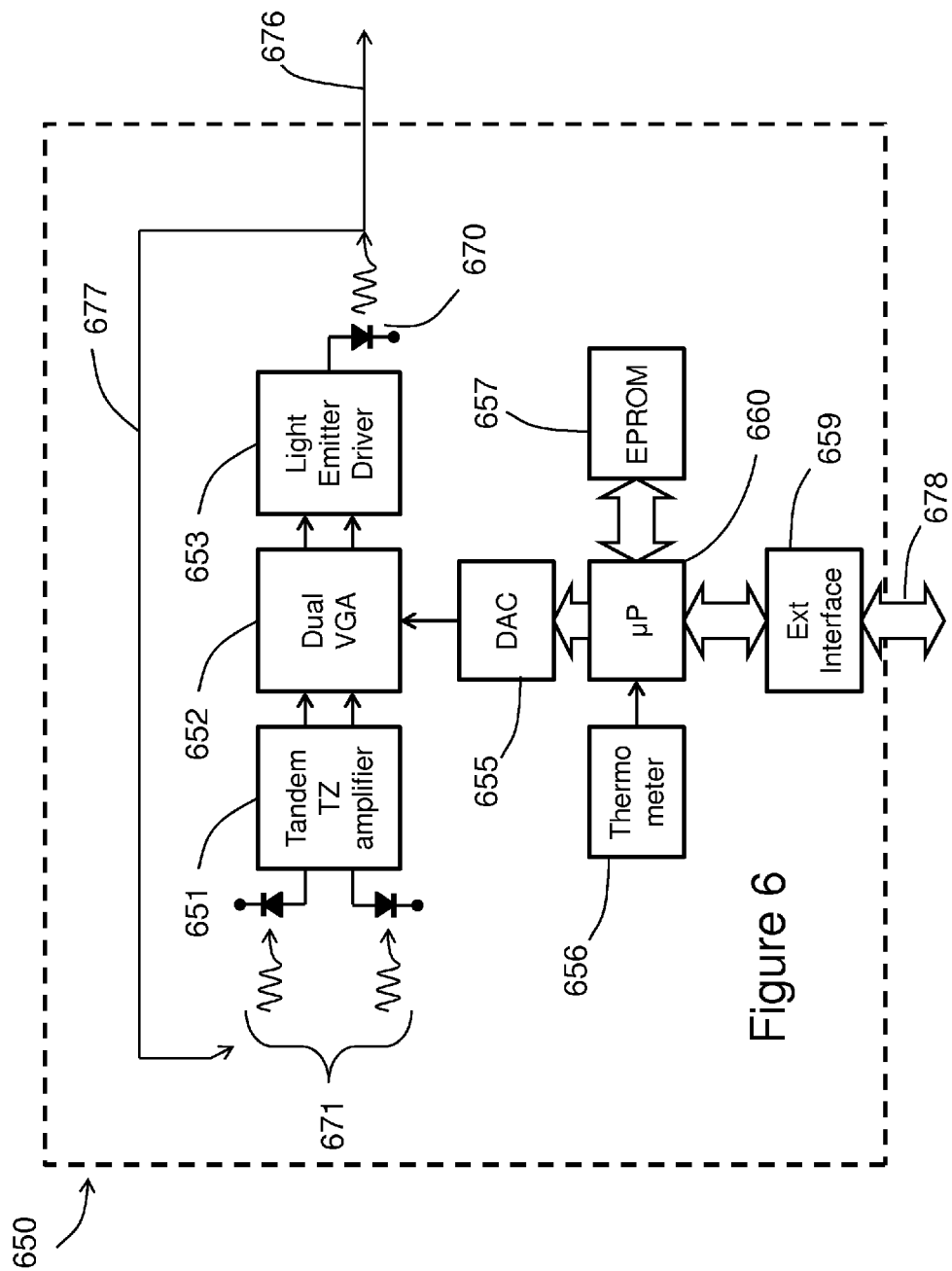
FIG. 6: Block diagram of functions of embodiment of a subsystem with an optical source made according to Embodiments B or C.

FIG. 6 illustrates the control and data flow inside a self-contained subsystem that emits temperature stable light and allows external remote control. This subsystem embodiment employs an optical source made according to embodiments B, or C, or their equivalents.

The subsystem comprises light-emitting diode or laser 670 which emits a beam of light that is partially reflected 677 according to the embodiments B or C and captured and detected by two detectors 671, and partially emitted from the subsystem as useful light beam 676. The detected light intensity 677 is converted to current at the photodetectors 671 and the tandem differential transimpedance amplifier 651 (in FIG. 4B, this is dash-line box 451), the two voltage outputs from 651 are amplified in the dual VGA stage 652 and fed to the adder/driver circuit 653 to drive the light-emitter 670. The ratio of the two gains $A_P/A_S$ in the dual VGA stage is controlled externally using a one or two voltage lines provided by a D/A converter 655. A thermometer 656 (typically a thermistor or a thermocouple) is used to measure the temperature of the optical source housing, namely the ambient temperature. This temperature information is converted to digital information and interpreted by the microprocessor 660. Based on the temperature value read by the thermometer 656, the microprocessor 660 computes the memory location in the EPROM 657 it needs to read and send to the Dual VGA stage 652 The sent value is the digital equivalent of the detector-polarization angle read from a table stored in EPROM 657. The data from the table stored in EPROM 657 is used by microprocessor 660 to determine the detector polarization angle associated with the measured temperature in case that the detector polarization angle is supposed to change with temperature or reads a fixed value in the case that the detector polarization angle is to remain constant throughout the operation of the source. The value of the angle is converted into a digital setting to be sent to DAC 655, then converted to an analog voltage (or voltages) and in this way the gain ratio in the Dual VGA is set to the required value. Under normal operation of optical source 650, this sequence is repeated any number of times per second limited by the speed of the microprocessor and the memory reading.

At the manufacturing stage, optical source 650 has to be calibrated. An example of the calibration system has already been disclosed in connection with FIG. 7 in the above text. The calibration is initiated externally by sending a signal to microprocessor 660 via an external interface 659, such as, USB protocol, over electrical communication lines 678.

VIII. Other Variations on the Embodiments

It will be clear to a person of ordinary skill in the art that a number of variations on the architectures disclosed in the figures and the written description can be made without departing from the spirit of the invention. For example, the useful output beam (403 in FIG. 4A) was taken as the beam transmitted through the beam splitter, while the beam used to monitor the power was reflected. It is clear that these two can be exchanged so that the beam exiting the optical source is actually reflected from the beam splitter and the beam transmitted is use to monitor the optical source power. One reason to employ this change would be to invert the composite functions $F_{TE}$ and $F_{TM}$ if they are undesirably large (or small). In yet another embodiment, the disclosed optical source provides optical output intensity that varies linearly with temperature, or varies with any custom function of temperature, rather than simply having a minimal variation with temperature.

The invention claimed is:

1. A light source comprising:
    a semiconductor light emitter having an electrical drive input, and being operatively configured to emit an unpolarized light beam;
    a first weakly polarizing beam splitter positioned to capture said light beam, reflect a portion of said light beam, and transmit a portion of said light beam, each of said reflected and said transmitted portions of said light beam exhibiting a degree of polarization of 90% or less, and said transmitted portion of said light beam having an output intensity P;
    a second polarizing beam splitter positioned to capture said reflected portion of said light beam and split said reflected portion of said light beam into first and second detector light beams, said first detector light beam having a polarization orthogonal to the polarization of the second detector light beam;
    first and second detectors capturing first and second detector light beams, said first detector having a first electrical output operatively configured to deliver a first output signal, and said second detector having a second electrical output operatively configured to deliver a second output signal; and,
    an electronic circuit coupled to said electrical outputs and said electrical drive input;
    wherein the emitted light beam has an intensity, and wherein said electronic circuit is operatively configured to compare each of said first and second output signals to a predetermined reference signal and adjust said intensity based on a weighted sum of said first and second output signals, the relative weighting of said first and second output signals being a function of a compensation parameter f so that said weighted sum weighs said first output in proportion to f and the second output in proportion to 1−f, given that f can take any value between and including zero and one.

2. The light source of claim 1, further comprising a thermometer operatively configured to produce a temperature signal, said electronic circuit configured to set a value of said compensation parameter f depending on said temperature signal.

3. The light source of claim 1, wherein for a range of ambient temperatures and for at least two different values $f_1$ and $f_2$ of said compensation parameter f said output intensity P varies with ambient temperature T so that the product of the change of output intensity P with ambient temperature T over said range when said compensation parameter equals $f_1$ ($dP(T,f_1)/dT$), and the change in output intensity P with ambient temperature T over said range when said compensation parameter equals $f_2$, ($dP(T,f_2)/dT$), is less than zero, as expressed by:

$$dP(T,f_1)/dT * dP(T,f_2)/dT < 0.$$

4. The light source of claim 1, wherein said semiconductor light emitter is selected from a group containing a light-emitting diode, a resonant-cavity light-emitting diode, and a superluminescent diode.

5. The light source of claim 1, wherein said first weakly polarizing beam splitter further comprises a first optical surface having a first interference coating and a second optical surface inclined at an non-zero angle relative to said first optical surface having a second interference coating, wherein said first interference coating design is different from said second interference coating design.

6. The light source of claim 2, further comprising a microprocessor and memory chip that hold a value of said compensation parameter f and an algorithm relating values of said temperature signal with said compensation parameter f.

* * * * *